US012658564B2

(12) United States Patent
Kim et al.

(10) Patent No.: US 12,658,564 B2
(45) Date of Patent: Jun. 16, 2026

(54) DISPLAY DEVICE

(71) Applicants: SAMSUNG DISPLAY CO., LTD.,
Yongin-si (KR); UNIST (ULSAN NATIONAL INSTITUTE OF SCIENCE AND TECHNOLOGY),
Ulsan (KR)

(72) Inventors: Ki Seo Kim, Yongin-si (KR); Gang Il Byun, Busan (KR); Jae Uk Choi, Yongin-si (KR); Jin Woo Kim, Yongin-si (KR); Hae Chan Chong, Ulsan (KR); Jin Myeong Heo, Suwon-si (KR)

(73) Assignee: SAMSUNG DISPLAY CO., LTD.,
Yongin-si (KR)

( * ) Notice: Subject to any disclaimer, the term of this patent is extended or adjusted under 35 U.S.C. 154(b) by 349 days.

(21) Appl. No.: 18/310,310

(22) Filed: May 1, 2023

(65) Prior Publication Data

US 2024/0055752 A1     Feb. 15, 2024

(30) Foreign Application Priority Data

Aug. 12, 2022     (KR) ........................ 10-2022-0101483

(51) Int. Cl.
*H01Q 1/24* (2006.01)
*G06F 3/044* (2006.01)
(Continued)

(52) U.S. Cl.
CPC ........... *H01Q 1/243* (2013.01); *G06F 3/0446* (2019.05); *H01Q 1/38* (2013.01); *H04M 1/0274* (2013.01);
(Continued)

(58) Field of Classification Search
CPC ........ H01Q 1/243; H01Q 1/38; H01Q 9/0407; H01Q 1/46; G06F 3/0446; H04M 1/0274;
(Continued)

(56) References Cited

U.S. PATENT DOCUMENTS

| | | | |
|---|---|---|---|
| 5,872,542 A | 2/1999 | Simons et al. | |
| 11,340,722 B2 * | 5/2022 | Oh ........................ | G06F 3/0446 |
| 2019/0220123 A1 * | 7/2019 | Kanaya ................. | H10K 59/40 |

FOREIGN PATENT DOCUMENTS

KR     10-2021-0052792     5/2021

OTHER PUBLICATIONS

Shahzad Ahmed, et al., "Hand Gestures Recognition Using Radar Sensors for Human-Computer-Interaction: A Review", Remote Sensing, 2021, 13, 527. https://doi.org/103390/rs13030527.
(Continued)

*Primary Examiner* — David E Lotter
(74) *Attorney, Agent, or Firm* — F. CHAU & ASSOCIATES, LLC

(57) ABSTRACT

A display device includes a substrate including a display area in which an image is displayed, a non-display area disposed around the display area, and an antenna area protruding from the non-display area. The display device further includes an antenna electrode disposed on one surface of the substrate in the non-display area, a first electrode disposed on the one surface of the substrate in the antenna area and spaced apart from the antenna electrode, and a feed line disposed on another surface of the substrate, which opposes the one surface, in the antenna area. The antenna electrode is connected to the feed line through a hole penetrating the substrate.

19 Claims, 33 Drawing Sheets

(51) Int. Cl.
*H01Q 1/38*       (2006.01)
*H04M 1/02*       (2006.01)
*H10K 59/123*     (2023.01)
*H10K 59/40*      (2023.01)

(52) U.S. Cl.
CPC ........ *H04M 1/0277* (2013.01); *H10K 59/123*
(2023.02); *H10K 59/40* (2023.02)

(58) Field of Classification Search
CPC .. H04M 1/0277; H04M 1/026; H04M 1/0266;
H10K 59/123; H10K 59/40; H10K 59/00;
H10K 59/131; H10K 59/805; H10K
59/12; H10K 50/805; H10K 50/844;
H10K 59/124; H10D 86/481; H10D
86/60; H10H 29/142; H05K 1/14
See application file for complete search history.

(56)                References Cited

OTHER PUBLICATIONS

Junho Park et al., "An Optically Invisible Antenna-on-Display
(AoD) Concept for Millimeter-wave 5G Cellular Devices", IEEE
Transactions on Antennas and Propagation, 2018.
Ryan B. Green et al., "Optically Transparent Antennas and Filters",
IEEE Antennas & Propagation Magazine, Jun. 2019.

* cited by examiner

AM, AL, GND2, GND3, APD1, APD2, APD3

DISL: SUB, TFTL, ENC, SENL

FIG. 14

AM: AE_1, GND2_1, GND3_1, AL_1,
     APD1_1, APD2_1, APD3_1

AM: AL, GND2, GND3, APD1, APD2, APD3

AM: AE_1, GND2_1, GND3_1, AL_1,
APD1_1, APD2_1, APD3_1

AM: GND1_1

DISPLAY DEVICE

CROSS-REFERENCE TO RELATED APPLICATION

This application claims priority under 35 U.S.C. § 119 to Korean Patent Application No. 10-2022-0101483, filed on Aug. 12, 2022, the disclosure of which is incorporated by reference herein in its entirety.

TECHNICAL FIELD

Embodiments of the present disclosure relate to a display device.

DISCUSSION OF RELATED ART

As technology advances, the demand for various forms of a display device for displaying an image is increasing. For example, a display device may be applied to various electronic devices such as a smartphone, a digital camera, a notebook computer, a navigation system, and a smart television.

The display device may include an antenna for transmitting and receiving electromagnetic waves for wireless communication. For example, the display device may include an antenna for performing 4th generation (4G) mobile communication and 5th generation (5G) mobile communication such as Long Term Evolution (LTE). The frequency band of the electromagnetic wave varies according to communication technology, and the shape or length of the antenna may vary according to the frequency band of the electromagnetic wave. Therefore, the display device may include an antenna electrode whose shape or length is determined according to the frequency band of the electromagnetic wave.

SUMMARY

At least one embodiment of the present disclosure provides a display device capable of proximity sensing such as gesture sensing including an antenna electrode.

According to an embodiment of the present disclosure, a display device includes a substrate including a display area in which an image is displayed, a non-display area disposed around the display area, and an antenna area protruding from the non-display area. The display device further includes an antenna electrode disposed on one surface of the substrate in the non-display area, a first electrode disposed on the one surface of the substrate in the antenna area and spaced apart from the antenna electrode, and a feed line disposed on another surface of the substrate, which opposes the one surface, in the antenna area. The antenna electrode is connected to the feed line through a hole penetrating the substrate.

The antenna electrode may be a patch antenna electrode having a rectangular planar shape.

The feed line may overlap the first electrode in a thickness direction of the substrate.

The antenna electrode may extend in one direction, and the feed line may extend in another direction crossing the one direction.

A thickness of the antenna electrode may be as about equal to a thickness of the first electrode.

A thickness of the antenna electrode may be smaller than a thickness of the feed line.

The display device may further include a second electrode disposed on the another surface of the substrate in the antenna area and disposed on one side of the feed line, and a third electrode disposed on the another surface of the substrate in the antenna area and disposed on another side of the feed line that opposes the one side.

The second electrode and the third electrode may overlap the first electrode in a thickness direction of the substrate.

A thickness of the antenna electrode may be about equal to a thickness of the second electrode and a thickness of the third electrode.

A thickness of the second electrode and a thickness of the third electrode may be smaller than a thickness of the first electrode.

The display device may further include an antenna circuit board disposed on a first antenna pad disposed at one end of the feed line, a second antenna pad disposed at one end of the second electrode, and a third antenna pad disposed on one end of the third electrode, a conductive adhesive member disposed between each of the first antenna pad, the second antenna pad, and the third antenna pad and the antenna circuit board, a main circuit board including a second connector connected to a first connector disposed at one end of the antenna circuit board, and an antenna driving circuit disposed on the main circuit board and configured to transmit and receive electromagnetic waves of the antenna electrode.

The hole may be disposed at another end of the feed line.

The display device may further include a dam surrounding the display area in the non-display area. The antenna electrode may be disposed between the dam and an edge of the substrate.

According to an embodiment of the present disclosure, a display device includes a substrate including a display area in which an image is displayed, a non-display area disposed around the display area, and an antenna area protruding from the non-display area. The display device further includes an antenna electrode disposed on one surface of the substrate in the non-display area, a feed line disposed on the one surface of the substrate in the antenna area, extended in a first direction, and connected to the antenna electrode, a first electrode disposed on another surface of the substrate, which opposes the one surface, in the antenna area, a second electrode disposed on the one surface of the substrate in the antenna area and disposed on one side of the feed line, and a third electrode disposed on the one surface of the substrate in the antenna area and disposed on another side of the feed line that opposes the one side. The antenna electrode includes a first electrode portion connected to the feed line and extended in the first direction, and a second electrode portion protruding from one side of the first electrode portion in a second direction crossing the first direction and overlapping the second electrode in the first direction.

The antenna electrode may include a third electrode portion protruding in the second direction from the another side of the first electrode portion, and a fourth electrode portion extended in the first direction and connected the third electrode and the third electrode portion.

The first electrode may overlap the feed line, the second electrode, and the third electrode in a thickness direction of the substrate.

A thickness of the antenna electrode, a thickness of the feed line, a thickness of the second electrode, and a thickness of the third electrode may be the same.

A thickness of the antenna electrode may be smaller than a thickness of the first electrode.

According to an embodiment of the present disclosure, a display device includes a substrate, a gate electrode of a thin film transistor disposed on one surface of the substrate, a first interlayer insulating layer disposed on the gate electrode of the thin film transistor, a first connection electrode disposed on the first interlayer insulating layer and connected to an active layer of the thin film transistor through a contact hole penetrating the gate insulating layer and the first interlayer insulating layer, a first organic layer disposed on the first connection electrode, a pixel electrode disposed on the first organic layer, and an antenna electrode disposed on the one surface of the substrate. The antenna electrode may include a first antenna electrode layer made of the same material as a gate electrode of the thin film transistor, a second antenna electrode layer made of the same material as the first connection electrode, and a third antenna electrode layer made of the same material as the pixel electrode.

The display device may further include a light emitting layer disposed on the pixel electrode, a common electrode disposed on the light emitting layer, an encapsulation layer disposed on the common electrode, and a sensor electrode disposed on the encapsulation layer. The antenna electrode may further include a fourth antenna electrode layer made of the same material as the sensor electrode.

The display device may further include an electrode disposed on another surface of the substrate that opposes the one surface of the substrate. A thickness of the electrode may be greater than a thickness of the first antenna electrode layer, the second antenna electrode layer, the third antenna electrode layer, and the fourth antenna electrode layer.

The display device may further include a feed line disposed on the another surface of the substrate, and an antenna connection electrode disposed in a hole penetrating the substrate and in contact with the feed line and the first antenna electrode layer.

A thickness of the feed line may be greater than a sum of a thickness of the first antenna electrode layer, a thickness of the second antenna electrode layer, a thickness of the third antenna electrode layer, and a thickness of the fourth antenna electrode layer.

According to the display device according to embodiments of the present disclosure, an electromagnetic wave having a frequency of an ultra-high frequency (e.g., millimeter wave (mmWave)) may be transmitted and received using an antenna electrode. As a result, a proximity touch such as a gesture sensing may be sensed.

According to the display device according to embodiments of the present disclosure, the antenna module is formed in the antenna area protruding from one side of the main area of the display panel and in the non-display area of the main area adjacent to the antenna area. Since the antenna area is bent under the display panel and only the antenna electrode is formed outside the dam in the non-display area, there is no need to provide a separate space in the display panel for the antenna module according to embodiments.

In addition, according to the display device according to embodiments of the present disclosure, the first to eighth antenna electrode layers of the antenna electrode are formed of the same material in the same process as a thin film transistor layer, a light emitting element layer, and the electrodes of the sensor electrode layer, and a feed line is formed of the same material as the heat dissipation layer of the panel bottom cover. Therefore, there is no need to add a separate process for forming the antenna electrode and the feed line according to embodiments.

In addition, according to the display device according to embodiments of the present disclosure, the first to eighth antenna electrode layers of the antenna electrode and the first to eighth feed line layers of the feed line are formed of the same material in the same process as the thin film transistor layer, the light emitting element layer, and the electrodes of the sensor electrode layer, and the electrode is formed of the same material as the heat dissipation layer of the panel bottom cover. Therefore, there is no need to add a separate process for forming the antenna electrode, the feed line, and the electrode according to embodiments.

BRIEF DESCRIPTION OF THE DRAWINGS

The above and other features of the present disclosure will become more apparent by describing in detail embodiments thereof, with reference to the accompanying drawings, in which:

FIG. 14 is a cross-sectional view illustrating an example of the display device taken along line B-B' of FIGS. 11 and 12;

FIG. 22 is a cross-sectional view illustrating an example of the display device taken along line E-E' of FIGS. 20 and 21;

FIG. 24 is a graph illustrating a reflection coefficient of an antenna module according to a frequency according to one or more embodiments;

5

Figure 27:
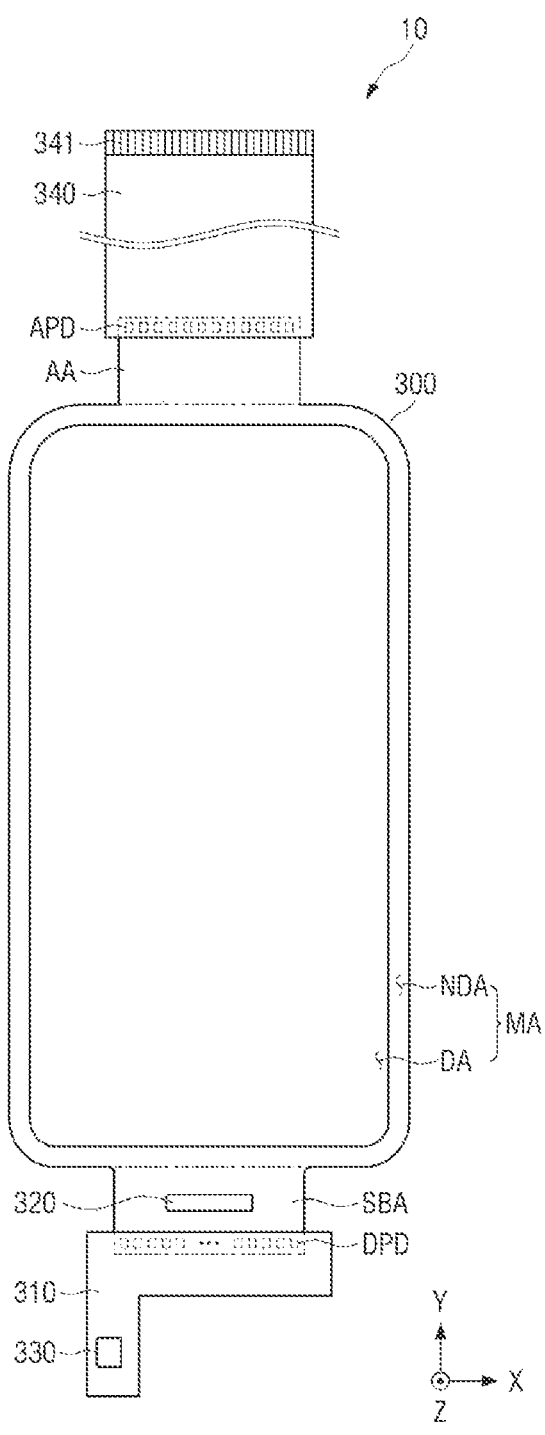
FIGS. 27 and 28 are plan views illustrating a display device according to one or more embodiments.
Figure 29:
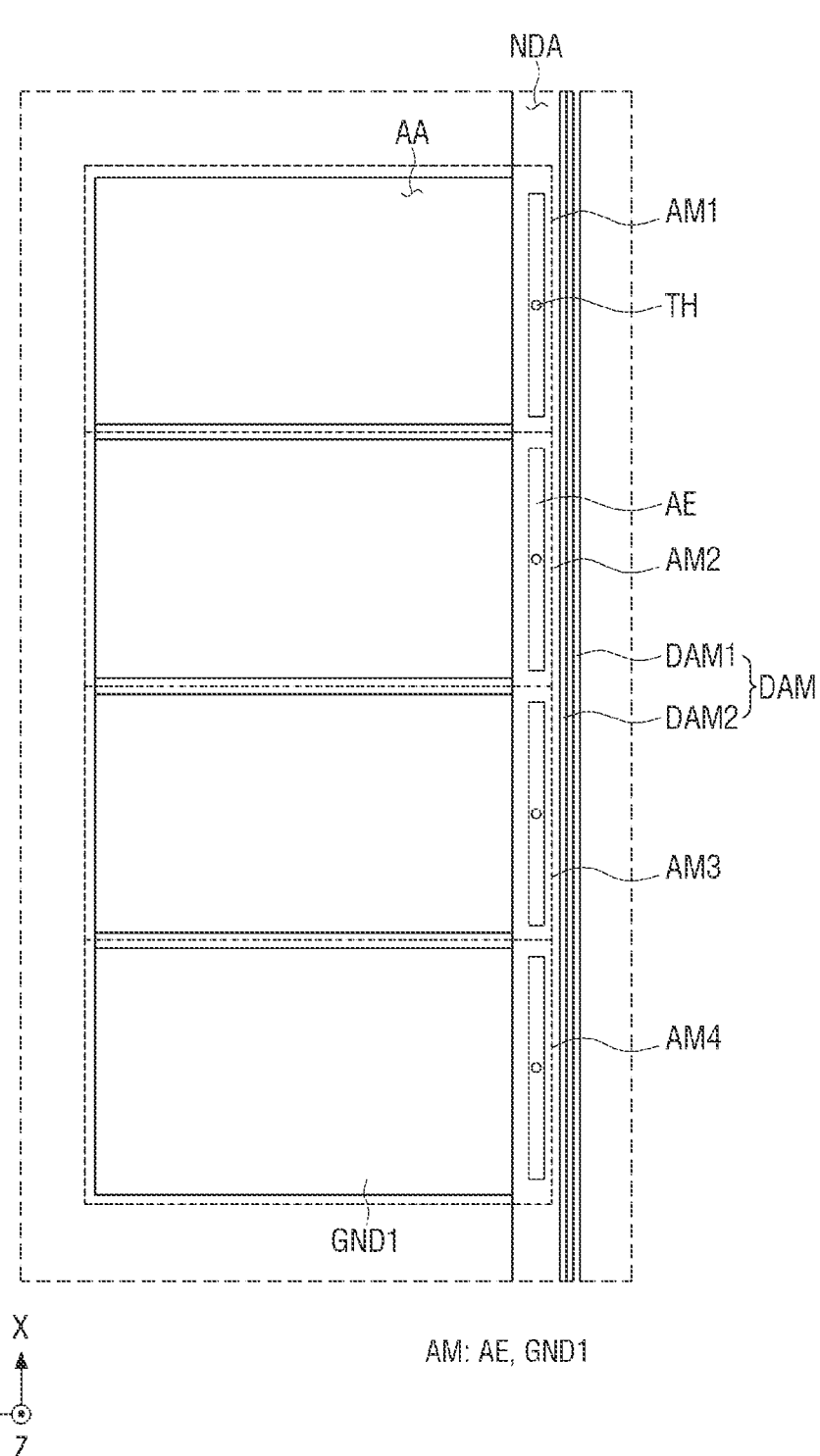
Figure 30:
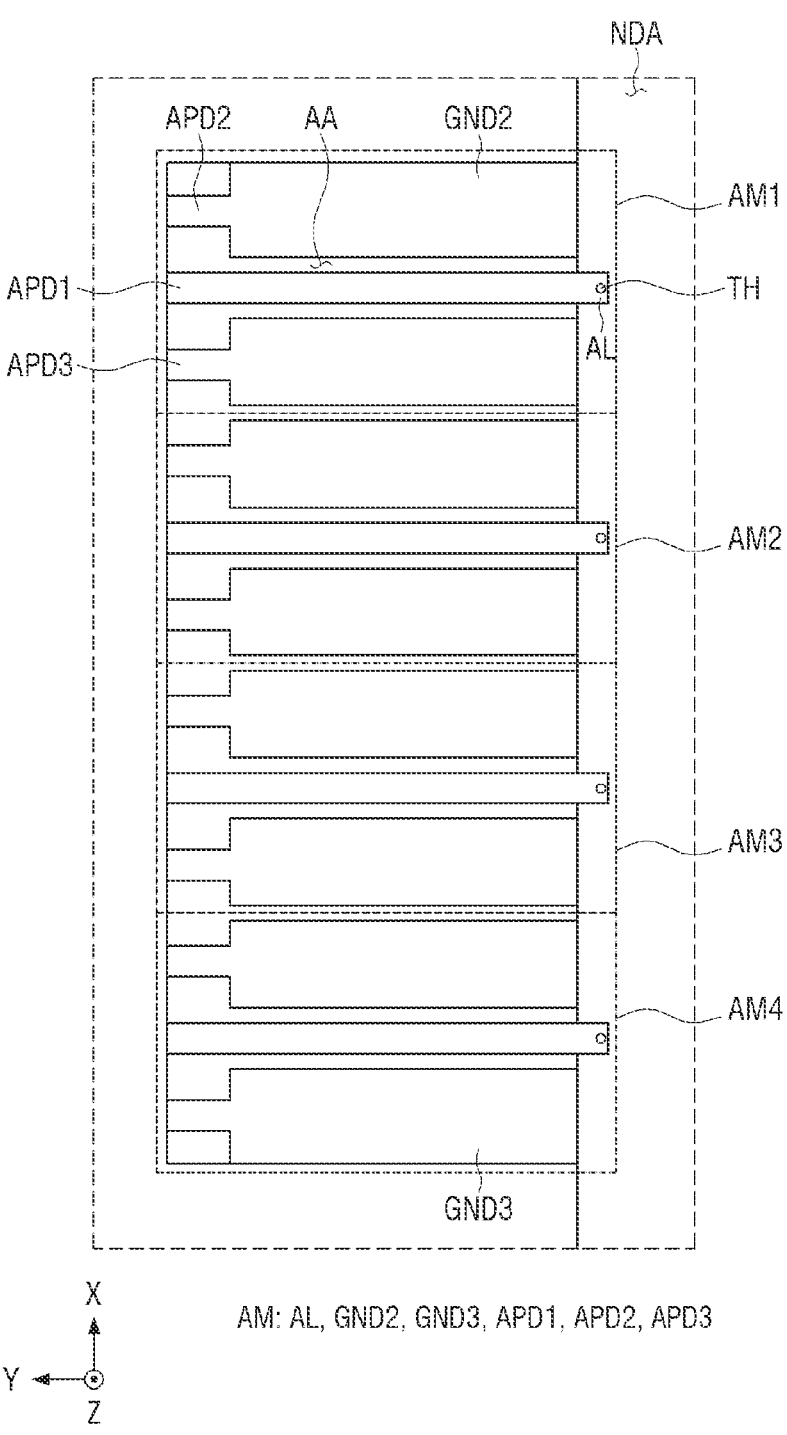
Figure 31:
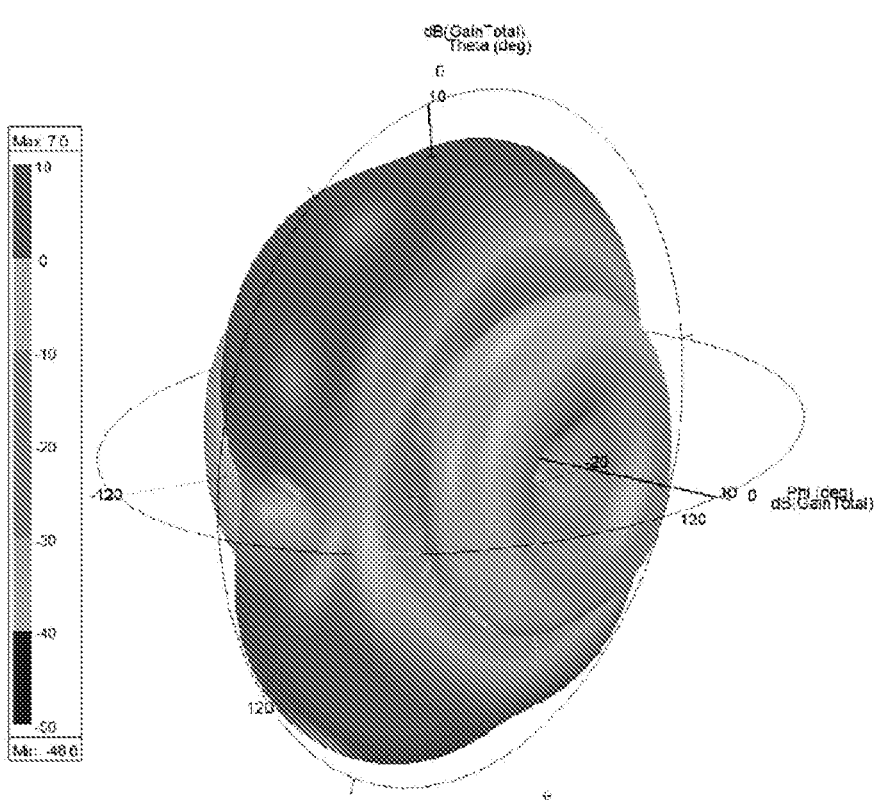
Figure 32:
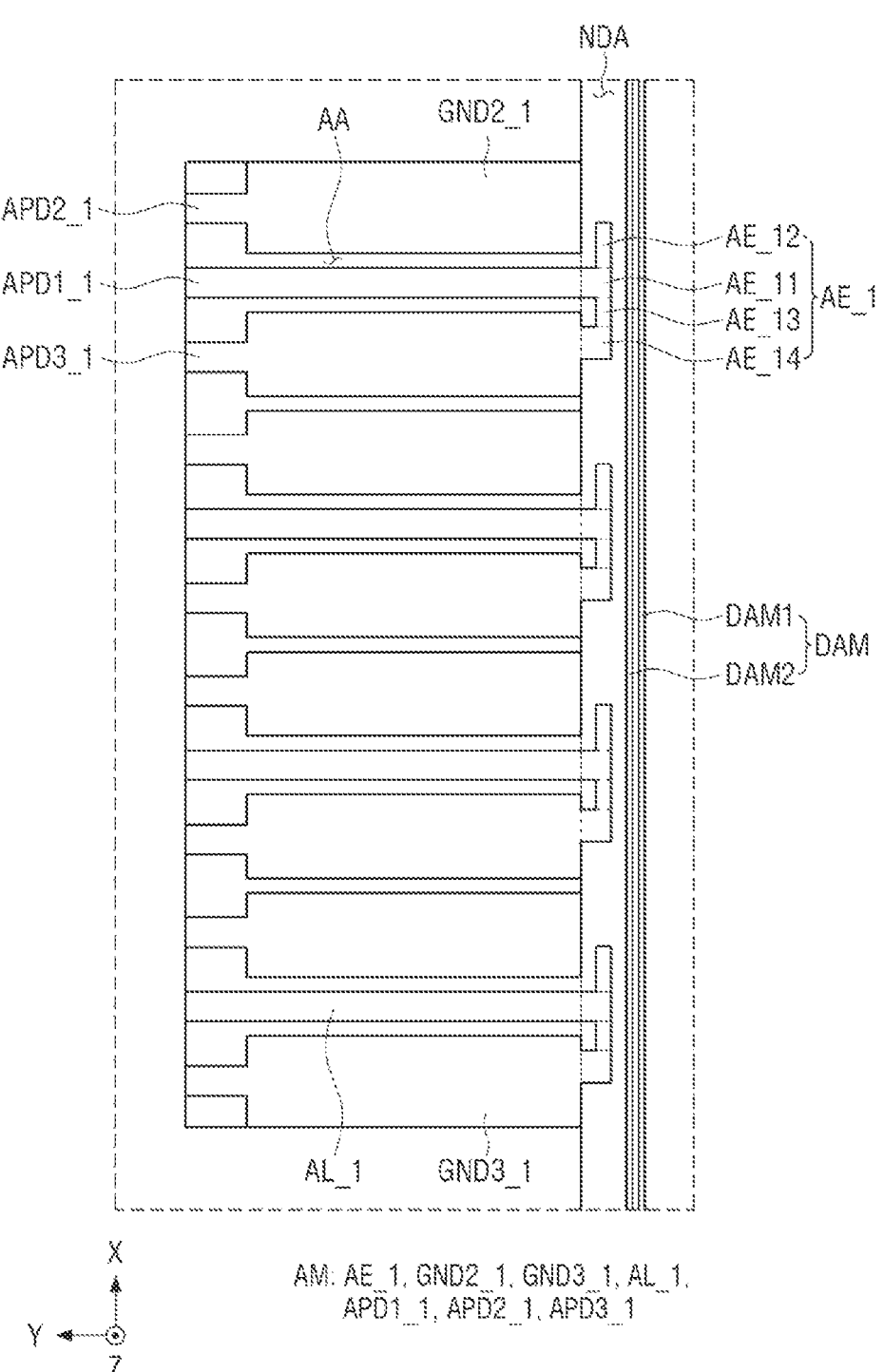
Figure 33:
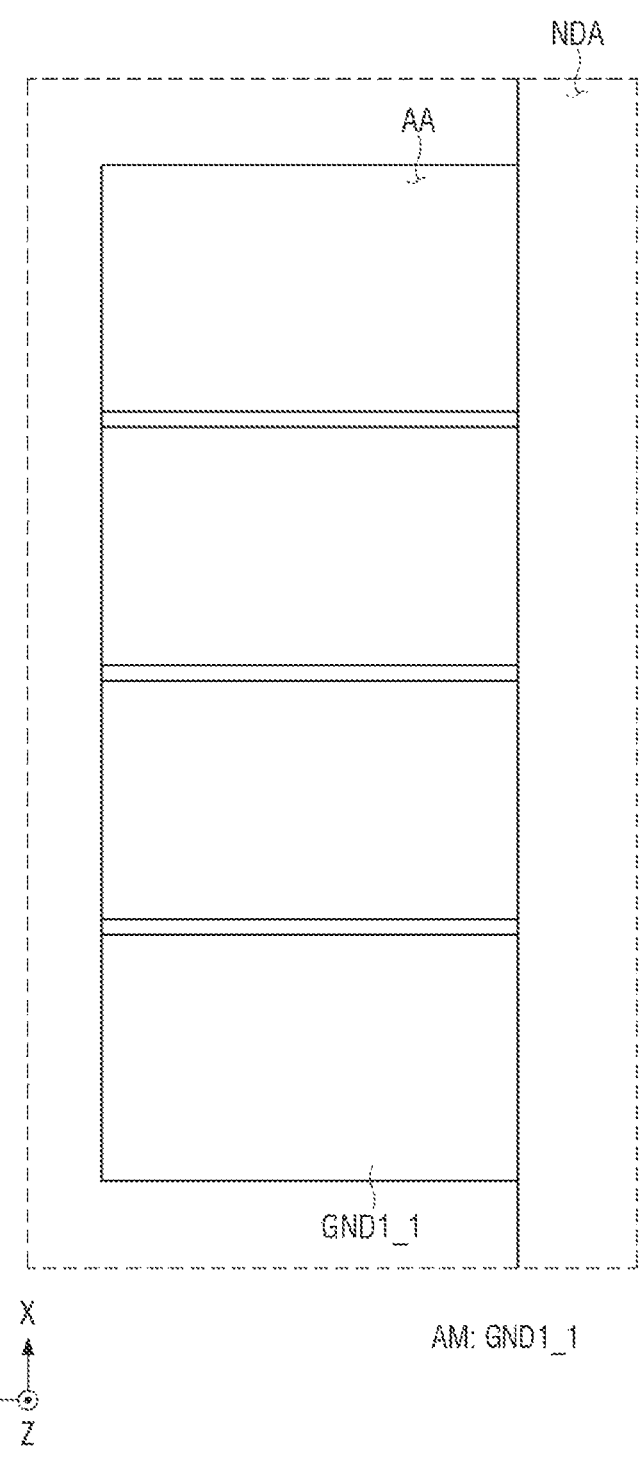

FIG. 29 is a plan view illustrating an example of the antenna area of FIG. 27;

FIG. 30 is a bottom view illustrating an example of the antenna area of FIG. 27;

FIG. 31 is a graph illustrating a reflection coefficient of an antenna module according to one or more embodiments;

FIG. 32 is a plan view illustrating an example of the antenna area of FIG. 27;

FIG. 33 is a bottom view illustrating an example of the antenna area of FIG. 27.

DETAILED DESCRIPTION

Embodiments of the present disclosure will be described more fully hereinafter with reference to the accompanying drawings. Like reference numerals may refer to like elements throughout the specification and the accompanying drawings.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationship between components should be interpreted in a like fashion.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words use to describe the relationship between elements may be interpreted in a like fashion.

It will be further understood that descriptions of features or aspects within each embodiment are available for other similar features or aspects in other embodiments, unless the context clearly indicates otherwise. Accordingly, all features and structures described herein may be mixed and matched in any desirable manner.

As used herein, the singular forms "a", "an" and "the" are intended to include the plural forms as well, unless the context clearly indicates otherwise.

Spatially relative terms, such as "below", "lower", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the term "below" may encompass both an orientation of above and below.

When a feature is said to extend, protrude, or otherwise follow a certain direction, it will be understood that the feature may follow said direction in the negative, i.e., opposite direction. Accordingly, the feature is not limited to follow exactly one direction, and may follow along an axis formed by the direction, unless the context clearly indicates otherwise.

Figure 1:
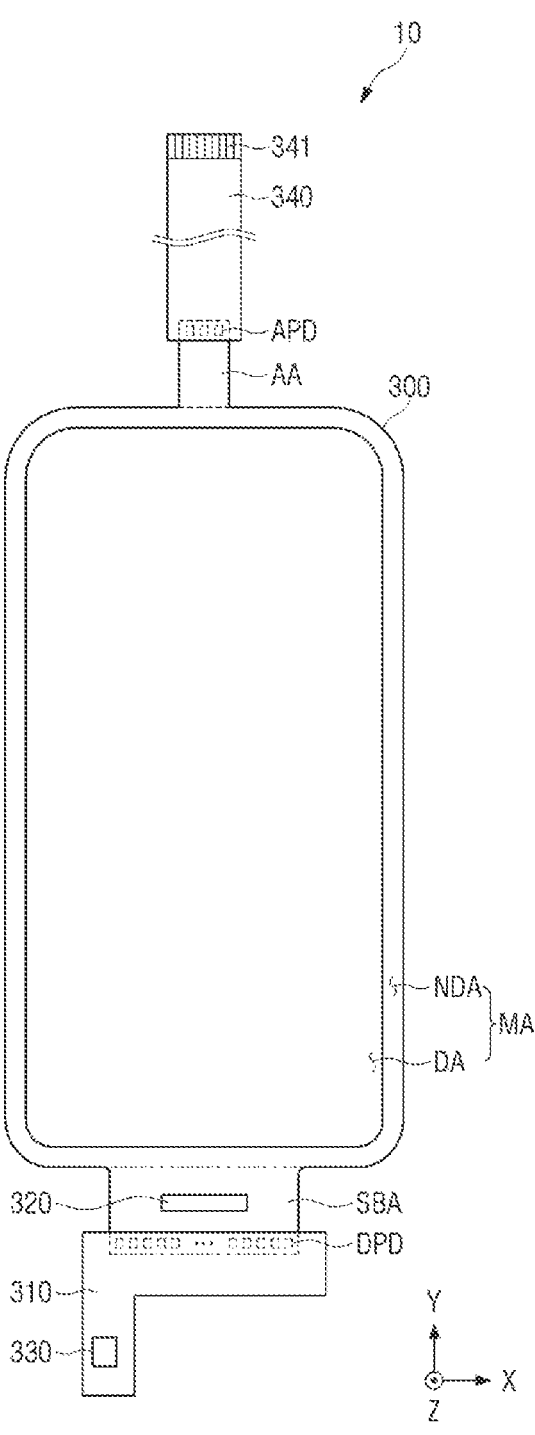
FIGS. 1 and 2 are plan views illustrating a display device according to one or more embodiments.
Figure 2:
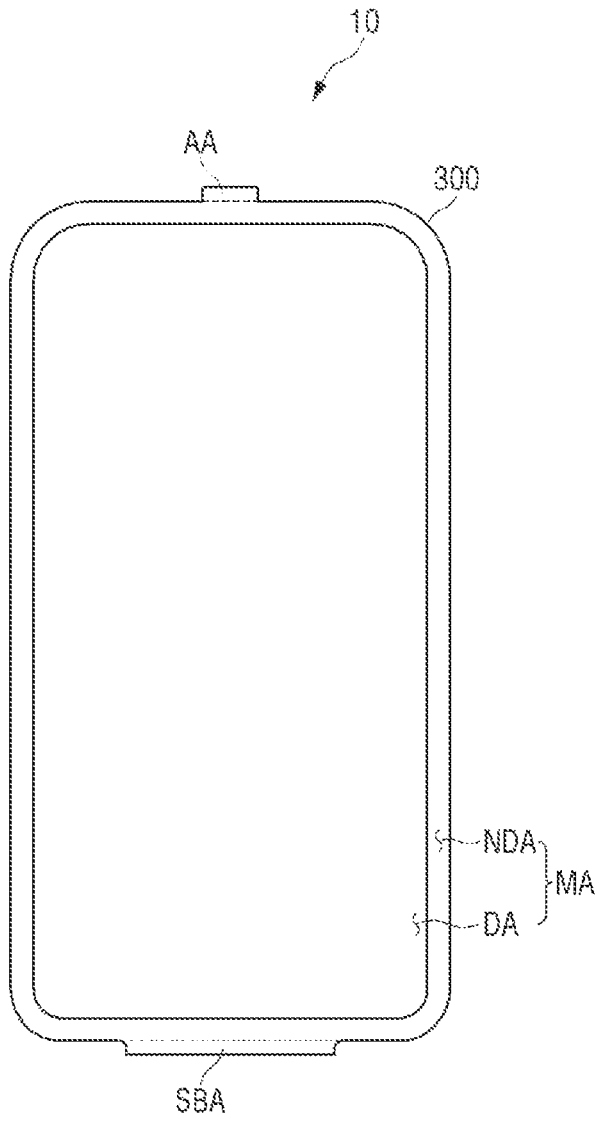
Figure 2:
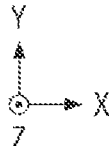

FIGS. 1 and 2 are plan views illustrating a display device according to one or more embodiments.

Referring to FIGS. 1 and 2, a display device 10 according to one or more embodiments may be applied to a portable electronic device such as, for example, a mobile phone, a smartphone, a tablet personal computer (PC), a mobile communication terminal, an electronic notebook, an electronic book, a portable multimedia player (PMP), a navigation system, an ultra mobile PC (UMPC). Alternatively, the display device 10 according to one or more embodiments may be applied as a display unit of, for example, a television, a notebook computer, a monitor, a billboard, or an Internet of Things (IoT) device. Alternatively, the display device 10 according to one or more embodiments may be applied to a wearable device such as, for example, a smartwatch, a watch phone, a glasses display, and a head mounted display (HMD). Alternatively, the display device 10 according to one or more embodiments may be applied to, for example, a dashboard of a vehicle, a center fascia of the vehicle, a center information display (CID) disposed on a dashboard of the vehicle, and a room mirror display instead of a side mirror of the vehicle, or a display placed on the back of the front seat as part of an entertainment device for the rear seat of the vehicle.

In this disclosure, a first direction (X-axis direction) may be a short side direction of the display device 10, for example, a horizontal direction of the display device 10. A second direction (Y-axis direction) may be a long side direction of the display device 10, for example, a vertical direction of the display device 10. A third direction (Z-axis direction) may be a thickness direction of the display device 10. An edge where the short side in the first direction (X-axis direction) and the long side in the second direction (Y-axis direction) meet may be rounded to have a predetermined curvature or may be formed at a right angle.

The display device 10 according to one or more embodiments includes a display panel 300, a display circuit board 310, a display driving circuit 320, a touch driving circuit 330, an antenna circuit board 340, and a first connector 341.

The display panel 300 may be a light emitting display panel including a light emitting element. For example, the display panel 300 may be an organic light emitting display panel using an organic light emitting diode including an organic light emitting layer, a micro light emitting diode display panel using a micro LED, a quantum dot light emitting display panel using a quantum dot light emitting diode including a quantum dot light emitting layer, or an inorganic light emitting display panel using an inorganic light emitting device including an inorganic semiconductor.

The display panel 300 may be a flexible display panel that is flexible and may be easily bent, folded, or rolled. For example, the display panel 300 may be a foldable display panel that may be folded and unfolded, a curved display panel in which the display surface is curved, a bended display panel in which an area other than the display surface is bent, a rollable display panel that may be stretched or a stretchable display panel that may be stretched.

The display panel 300 may include a main area MA, a sub area SBA protruding from one side of the main area MA, and an antenna area AA protruding from the other side of the main area MA.

The main area MA may include a display area DA in which an image is displayed and a non-display area NDA that is a peripheral area of the display area DA. The display area DA may occupy most of the main area MA. The display area DA may be disposed in the center of the main area MA. The non-display area NDA may be an area outside the display area DA. The non-display area NDA may be defined as an edge area of the display panel 300.

The sub area SBA may protrude in the second direction (Y-axis direction) from one side of the main area MA. For example, one side of the main area MA may be a bottom side of the main area MA. As shown in FIG. 1, a length in the first direction (X-axis direction) of the sub-area SBA is smaller than a length in the first direction (X-axis direction) of the main area MA, and a length of the sub area SBA in the second direction (Y-axis direction) may be smaller than a length of the main area MA in the second direction (Y-axis direction). However, embodiments of the present disclosure are not limited thereto.

As shown in FIG. 2, the sub area SBA may be bent and disposed under the display panel 300. In this case, the sub area SBA may overlap the main area MA of the display panel 300 in the third direction (Z-axis direction).

Display pads DPD may be disposed on one edge of the sub area SBA. One side edge of the sub area SBA may be a bottom edge of the sub area SBA. The display circuit board 310 may be attached on the display pads DPD of the sub area SBA. The display circuit board 310 may be attached to the display pads DPD of the sub area SBA using a conductive adhesive member such as, for example, an anisotropic conductive film and an anisotropic conductive paste. The display circuit board 310 may be a composite printed circuit board including flexible printed circuit boards (FPCB) that may be bent, and rigid printed circuit boards (PCB) that are rigid and not easily bent, or both a rigid printed circuit board and a flexible printed circuit board.

The display driving circuit 320 may be disposed in the sub area SBA of the display panel 300. The display driving circuit 320 may receive control signals and power voltages and generate and output signals and voltages for driving the display panel 300. The display driving circuit 320 may be an integrated circuit (IC).

The touch driving circuit 330 may be disposed on the display circuit board 310. The touch driving circuit 330 may be an integrated circuit. The touch driving circuit 330 may be attached to the display circuit board 310.

The touch driving circuit 330 may be electrically connected to the sensor electrodes of the sensor electrode layer of the display panel 300 through the display circuit board 310. Therefore, the touch driving circuit 330 may output a touch driving signal to each of the sensor electrodes and sense a voltage charged in the mutual capacitance of the sensor electrodes.

The sensor electrode layer of the display panel 300 may sense a contact touch rather than a proximity touch. The contact touch refers to direct contact of an object such as a human finger or a pen with a cover window disposed on the sensor electrode layer. Proximity touch refers to an object such as a person's finger or a pen being placed in close proximity on a cover window without physically contacting the cover window, such as hovering.

A power supply unit for supplying driving voltages for driving the display pixels of the display panel 300 and the display driving circuit 320 may be additionally disposed on the display circuit board 310. Alternatively, the power supply unit may be integrated with the display driving circuit 320, and in this case, the display driving circuit 320 and the power supply unit may be formed as one integrated circuit.

The antenna area AA may be an area including at least one component among an antenna electrode, a feed line, and an electrode of an antenna module for wireless transmission and reception. The antenna area AA may protrude in the second direction (Y-axis direction) from the other side of the main area MA. For example, the other side of the main area MA may be an upper side of the main area MA. As shown in FIG. 1, the length in the first direction (X-axis direction) of the antenna area AA may be smaller than the length of the main area MA in the first direction (X-axis direction), and the length of the second direction (Y-axis direction) of the antenna area AA may be smaller than the length in the second direction (Y-axis direction) of the main area MA. However, embodiments of the present disclosure are not limited thereto.

As shown in FIG. 2, the antenna area AA may be bent and disposed under the display panel 300. In this case, the antenna area AA may overlap the main area MA of the display panel 300 in the third direction (Z-axis direction).

Antenna pads APD may be disposed at one edge of the antenna area AA. The antenna circuit board 340 may be attached on the antenna pads APD of the antenna area AA. The antenna circuit board 340 may be attached on the antenna pads APD of the antenna area AA using the anisotropic conductive film and the conductive adhesive member such as the anisotropic conductive adhesive. One side of the antenna circuit board 340 may include a first connector connected to the main circuit board on which the antenna driving circuit (see 350 in FIG. 4) is mounted. The antenna circuit board 340 may be a bendable flexible circuit board (FPCB).

Figure 3:
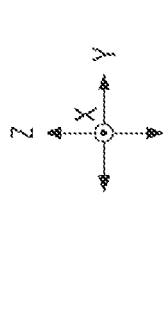
FIGS. 3 and 4 are side views illustrating a display device according to one or more embodiments.
Figure 4:
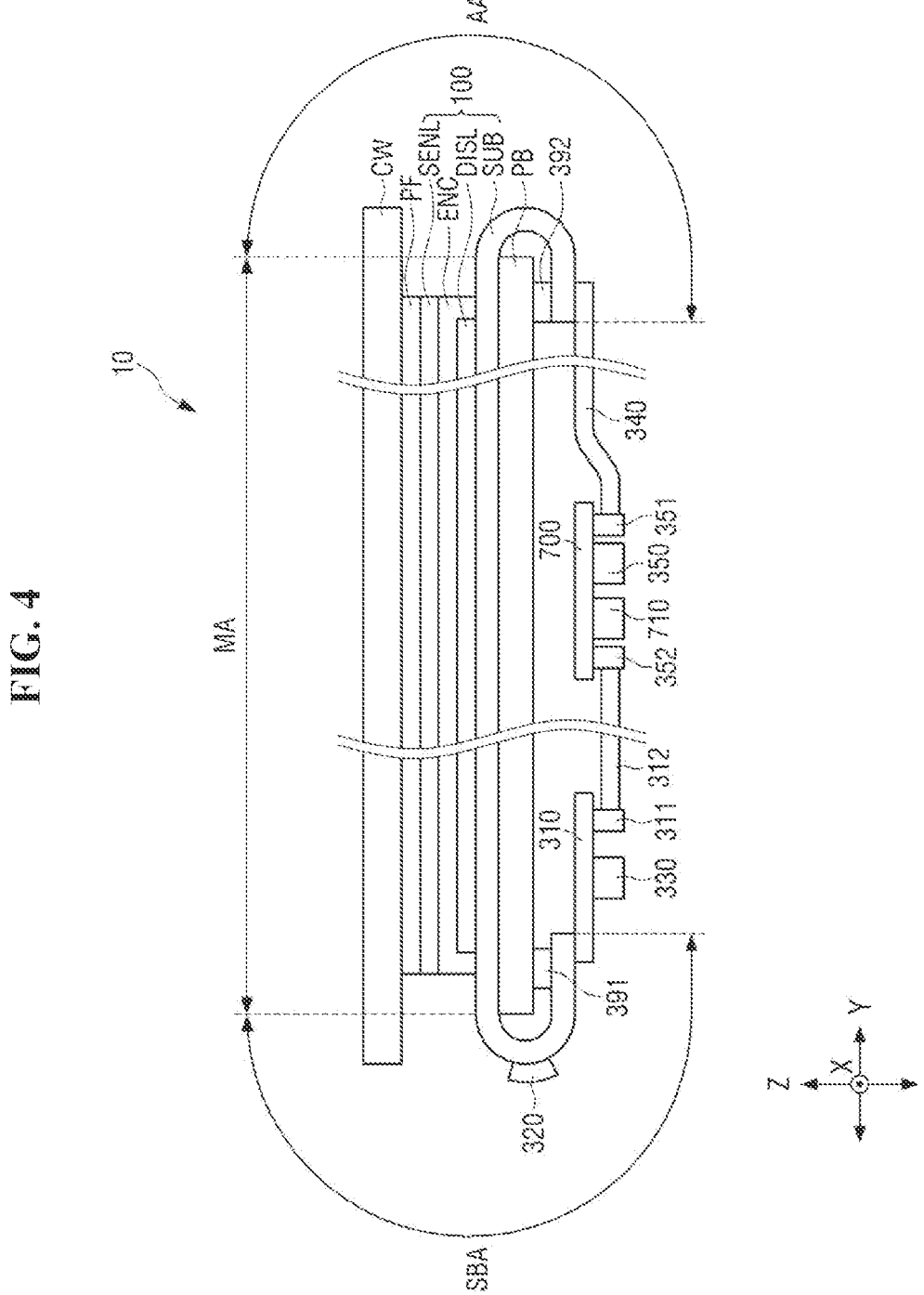

FIGS. 3 and 4 are side views illustrating a display device according to one or more embodiments.

Referring to FIGS. 3 and 4, the display device 10 according to one or more embodiments may include the display panel 300, a polarizing film PF, a cover window CW, and a panel bottom cover PB. The display panel 300 may include a substrate SUB, a display layer DISL, an encapsulation layer ENC, and a sensor electrode layer SENL.

The substrate SUB may be made of an insulating material such as a polymer resin. The substrate SUB may be a flexible substrate capable of bending, folding, rolling, or the like.

The display layer DISL may be disposed in the main area MA of the substrate SUB. The display layer DISL may be a layer that displays an image including light emitting areas. The display layer DISL may include the thin film transistor layer in which thin film transistors are formed, and the light emitting element layer in which light emitting elements emitting light are disposed in light emitting areas.

In the display area DA of the display layer DISL, scan lines, data lines, and power supply lines for driving light emitting elements in the light emitting areas as well as the light emitting areas may be disposed. In the non-display area NDA of the display layer DISL, a scan driver that outputs scan signals to the scan lines, and fan-out lines connecting the data lines and the display driving circuit 320 may be disposed.

The encapsulation layer ENC may be disposed on the display layer DISL. The encapsulation layer ENC may encapsulate the light emitting element layer of the display layer DISL, which may prevent oxygen or moisture from penetrating into the light emitting element layer of the display layer DISL. The encapsulation layer ENC may be disposed on the top surface and side surfaces of the display layer DISL.

The sensor electrode layer SENL may be disposed on the display layer DISL. The sensor electrode layer SENL may include sensor electrodes. The sensor electrode layer SENL may sense a touch using sensor electrodes.

The polarizing film PF may be disposed on the sensor electrode layer SENL. The polarizing film PF may include a first base member, a linear polarizing plate, a retardation film such as a λ/4 plate (quarter-wave plate), and a second base member. The first base member, a phase delay film, the linear polarizer, and the second base member may be sequentially stacked on the sensor electrode layer SENL.

The cover window CW may be disposed on the polarizing film PF. The cover window CW may be attached to the polarizing film PF by a transparent adhesive member such as an optically clear adhesive (OCA) film.

The panel bottom cover PB may be disposed under the display panel 300. The panel bottom cover PB may be attached to the lower surface of the display panel 300 through the adhesive member. The adhesive member may be a pressure sensitive adhesive (PSA). The panel bottom cover PB may include at least one of a light blocking member for absorbing light incident from outside of the display device 10, a buffer member for absorbing an impact from outside of the display device 10, and a heat dissipation member for efficiently dissipating heat of the display panel 300.

The light blocking member may be disposed under the display panel 300. The light blocking member blocks light transmission to prevent components disposed under the light blocking member, for example, the display circuit board 310, from being viewed from above the display panel 300 (from being viewed by the user). The light blocking member may include a light absorbing material such as, for example, a black pigment or a black dye.

The buffer member may be disposed under the light blocking member. The buffer member may absorb an external shock, which may prevent the display panel 300 from being damaged. The buffer member may be formed of a single layer or a plurality of layers. For example, the buffer member may be formed of a polymer resin such as poly-urethane, polycarbonate, polypropylene, polyethylene, or the like or may include a material having elasticity, such as rubber, a urethane-based material, or a sponge formed by foam molding an acrylic-based material.

The heat dissipation member may be disposed under the buffer member. The heat dissipation member may include a first heat dissipation layer including graphite or carbon nanotubes and a second heat dissipation layer formed of a thin metal film such as, for example, copper, nickel, ferrite, or silver, which may shield electromagnetic waves and has excellent thermal conductivity.

As shown in FIG. 4, the sub area SBA of the substrate SUB may be bent and disposed under the display panel 300. The sub area SBA of the substrate SUB may be attached to the lower surface of the panel bottom cover PB by a first adhesive member 391. The first adhesive member 391 may be a pressure-sensitive adhesive.

Also, as shown in FIG. 4, the antenna area AA of the substrate SUB may be bent and disposed under the display panel 300. The antenna area AA of the substrate SUB may be attached to the lower surface of the panel bottom cover PB by a second adhesive member 392. The second adhesive member 392 may be a pressure-sensitive adhesive.

The display circuit board 310 may be attached to the display pads DPD of the sub area SBA of the substrate SUB using the anisotropic conductive film and the conductive adhesive member such as the anisotropic conductive adhesive. The display circuit board 310 may include a connector 311 connected to a flexible circuit board 312. The display circuit board 310 may be connected to a main circuit board 700 by the flexible circuit board 312.

The touch driving circuit 330 may be disposed on the display circuit board 310. The touch driving circuit 330 generates touch data according to a change in an electrical signal sensed by each of the sensor electrodes of the sensor electrode layer of the display panel 300, and transmits the touch data to a main processor 710 of the main circuit board 700. The main processor 710 may calculate touch coordinates in which a touch occurs by analyzing the touch data.

The antenna circuit board 340 may be attached to the antenna pads APD of the antenna area AA of the substrate SUB using the conductive adhesive member such as the anisotropic conductive film and the anisotropic conductive adhesive. A connector 351 of the antenna circuit board 340 may be connected to the connector 351 of the main circuit board 700. The antenna area AA may be connected to the main circuit board 700 by the antenna circuit board 340.

The main circuit board 700 may be a rigid printed circuit board (PCB) that is hard and is not easily bent. The main processor 710 and an antenna driving circuit 350 may be disposed on the main circuit board 700.

The antenna driving circuit 350 may be electrically connected to the antenna electrodes of the display panel 300 through the antenna circuit board 340. Therefore, the antenna driving circuit 350 may receive the electromagnetic wave signal received by the antenna electrodes, and output the electromagnetic wave signal to be transmitted to the antenna electrodes. An antenna circuit board 340 may be an integrated circuit (IC).

The antenna driving circuit 350 may process electromagnetic wave signals transmitted and received to and from the antenna electrodes. For example, the antenna driving circuit 350 may change the amplitude of the electromagnetic wave signal received by the antenna electrodes. Alternatively, an antenna driving circuit 350 may change the phase as well as the amplitude of the electromagnetic wave signal received by the antenna electrodes. The antenna driving circuit 350 may transmit the processed electromagnetic wave signal to the mobile communication module. The mobile communication module may be disposed on the main circuit board 700.

In addition, the antenna driving circuit 350 may change the amplitude of the electromagnetic wave signal transmitted from the mobile communication module. Alternatively, the antenna driving circuit 350 may change the phase as well as the amplitude of the electromagnetic wave signal transmitted from the mobile communication module. The antenna driving circuit 350 may transmit the processed electromagnetic wave signal to the antenna electrodes.

Figure 5:
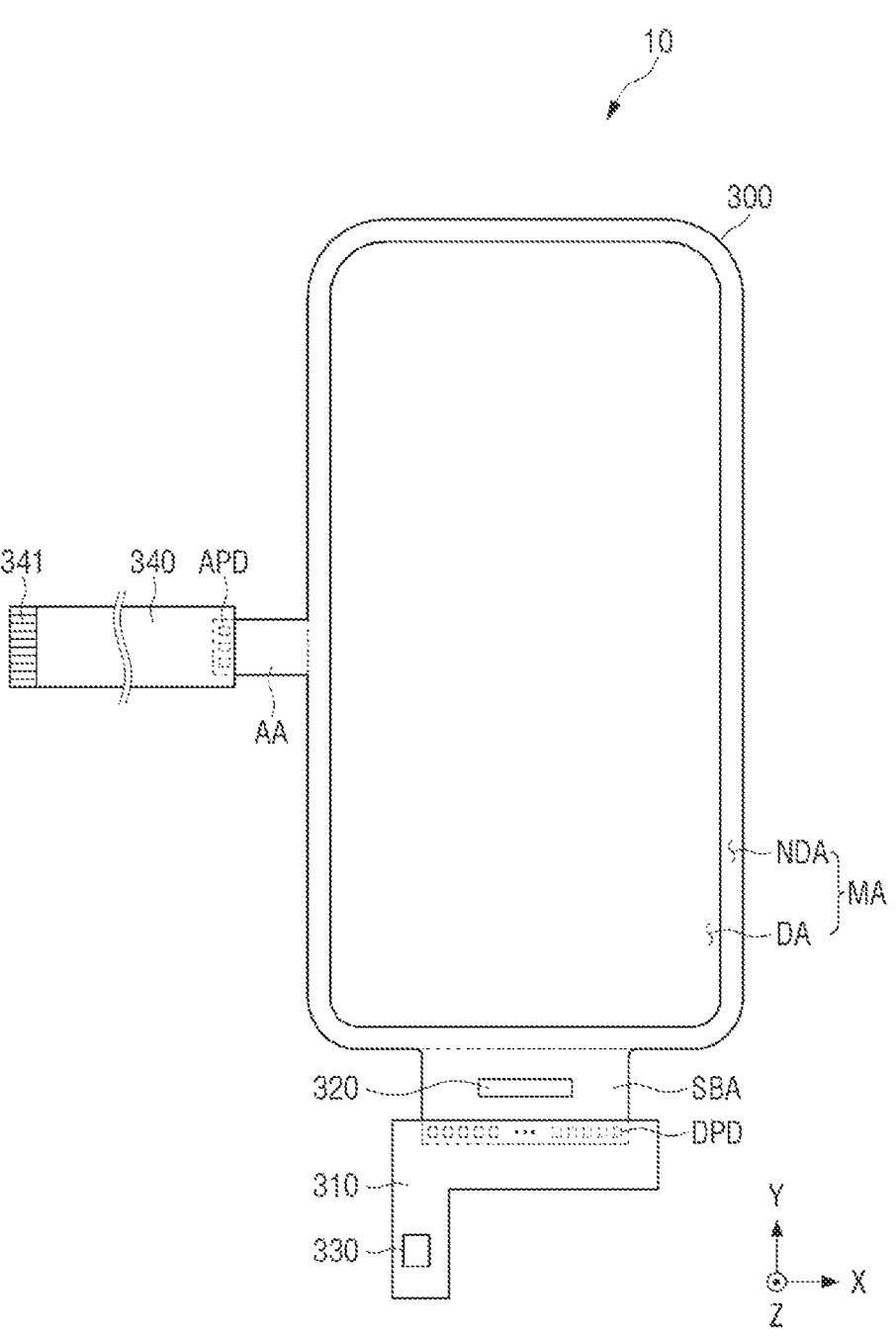
FIGS. 5 and 6 are plan views illustrating a display device according to one or more embodiments.
Figure 6:
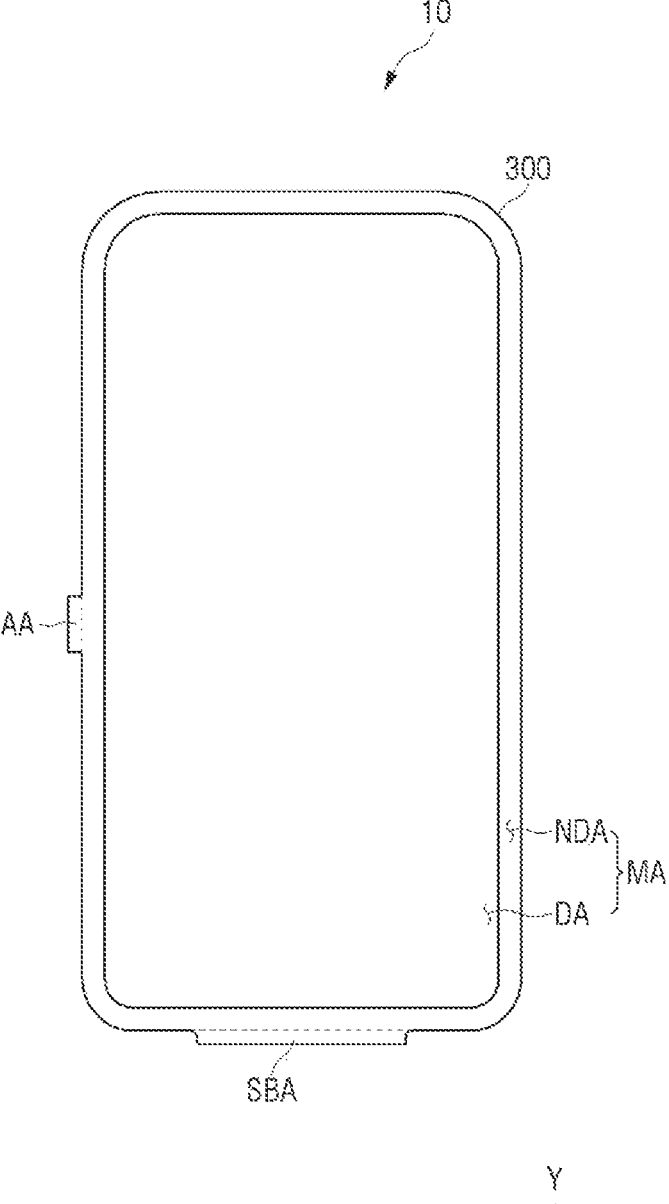
Figure 7:
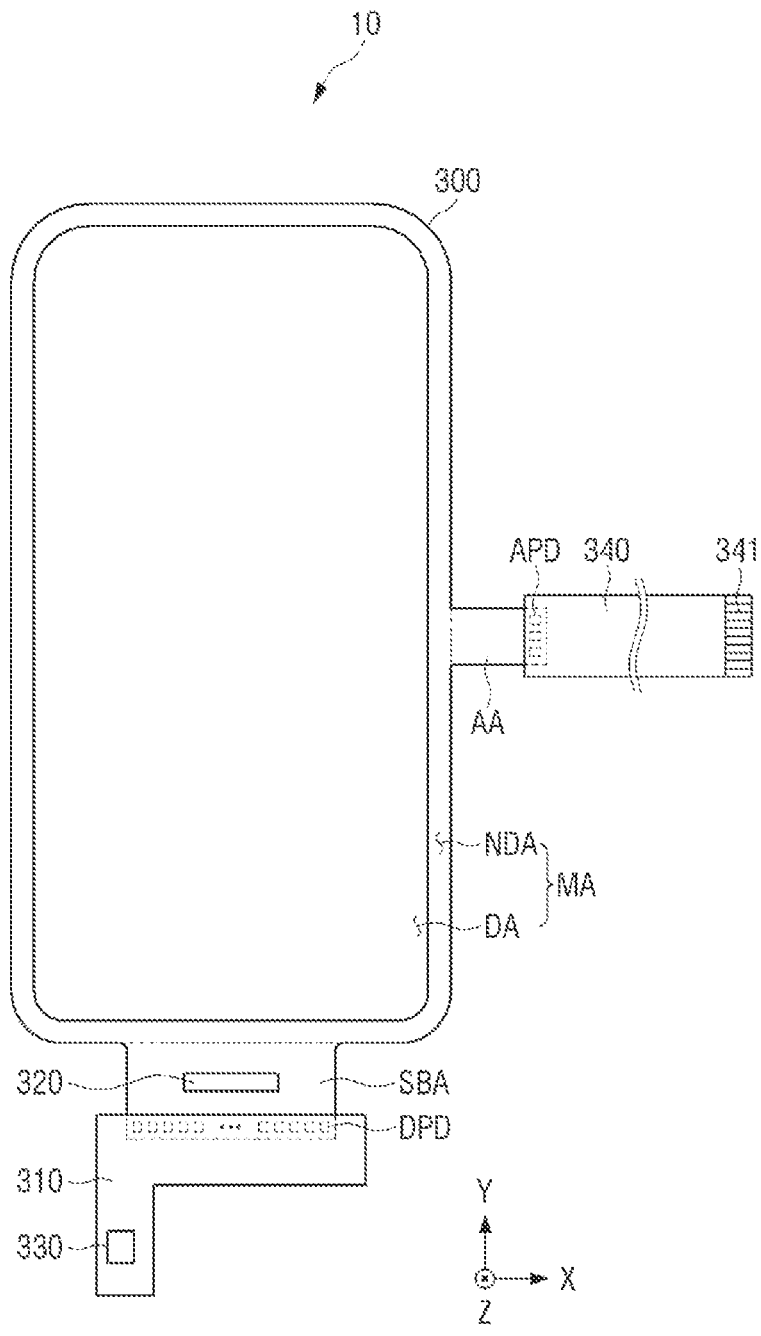
FIGS. 7 and 8 are plan views illustrating a display device according to one or more embodiments.
Figure 8:
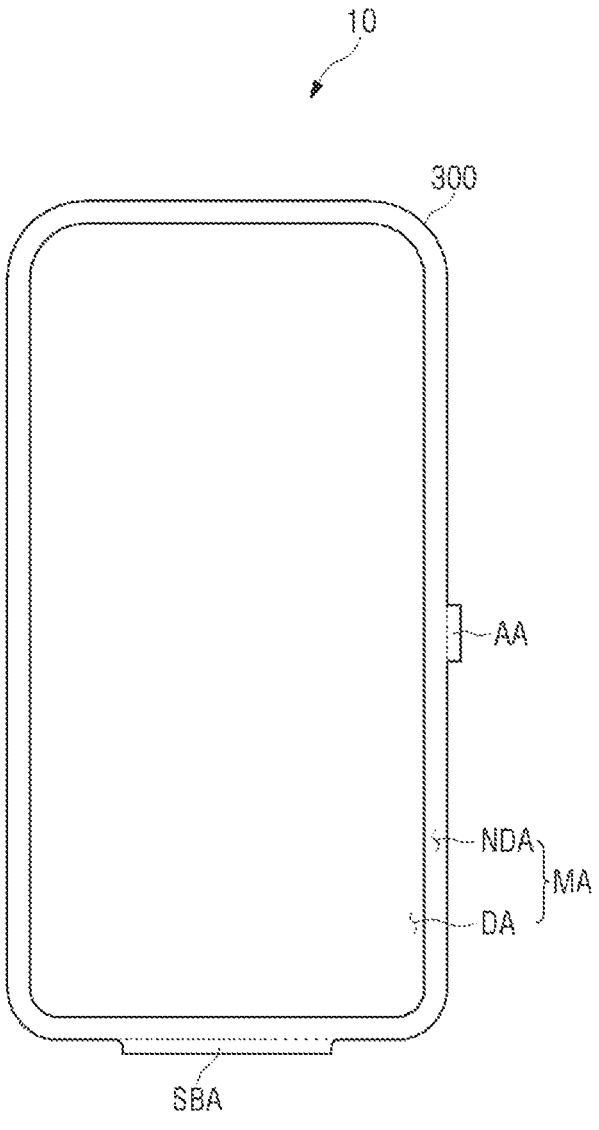

FIGS. 5 and 6 are plan views illustrating a display device according to one or more embodiments. FIGS. 7 and 8 are plan views illustrating a display device according to one or more embodiments.

The embodiments of FIGS. 5 and 6 are different from the embodiments of FIGS. 1 and 2 in that the antenna area AA protrudes in the first direction (X-axis direction) from the left side of the main area MA. The embodiments of FIGS. 7 and 8 are different from the embodiments of FIGS. 1 and 2 in that the antenna area AA protrudes in the first direction (X-axis direction) from the right side of the main area MA. When referring to FIGS. 5 to 8, for convenience of explanation, a further description of components and technical aspects previously described with reference to FIGS. 1 and 2 will be omitted.

As shown in FIGS. 5 to 8, the antenna area AA may protrude from one side of the main area MA, and the one side of the main area MA may be any one of the upper, lower, left, and right sides of the main area MA.

When the antenna area AA protrudes from the lower side of the main area MA in the second direction (Y-axis direction), the antenna area AA may be placed apart from the sub-area SBA in the first direction (X-axis direction). In this case, the length in the first direction (X-axis direction) of the antenna area AA may be smaller than the length in the first direction (X-axis direction) of the sub area SBA, and the length of the second direction (Y-axis direction) of the antenna area AA may be smaller than the length of the second direction (Y-axis direction) of the sub-area SBA. However, embodiments of the present disclosure are not limited thereto.

Figure 9:
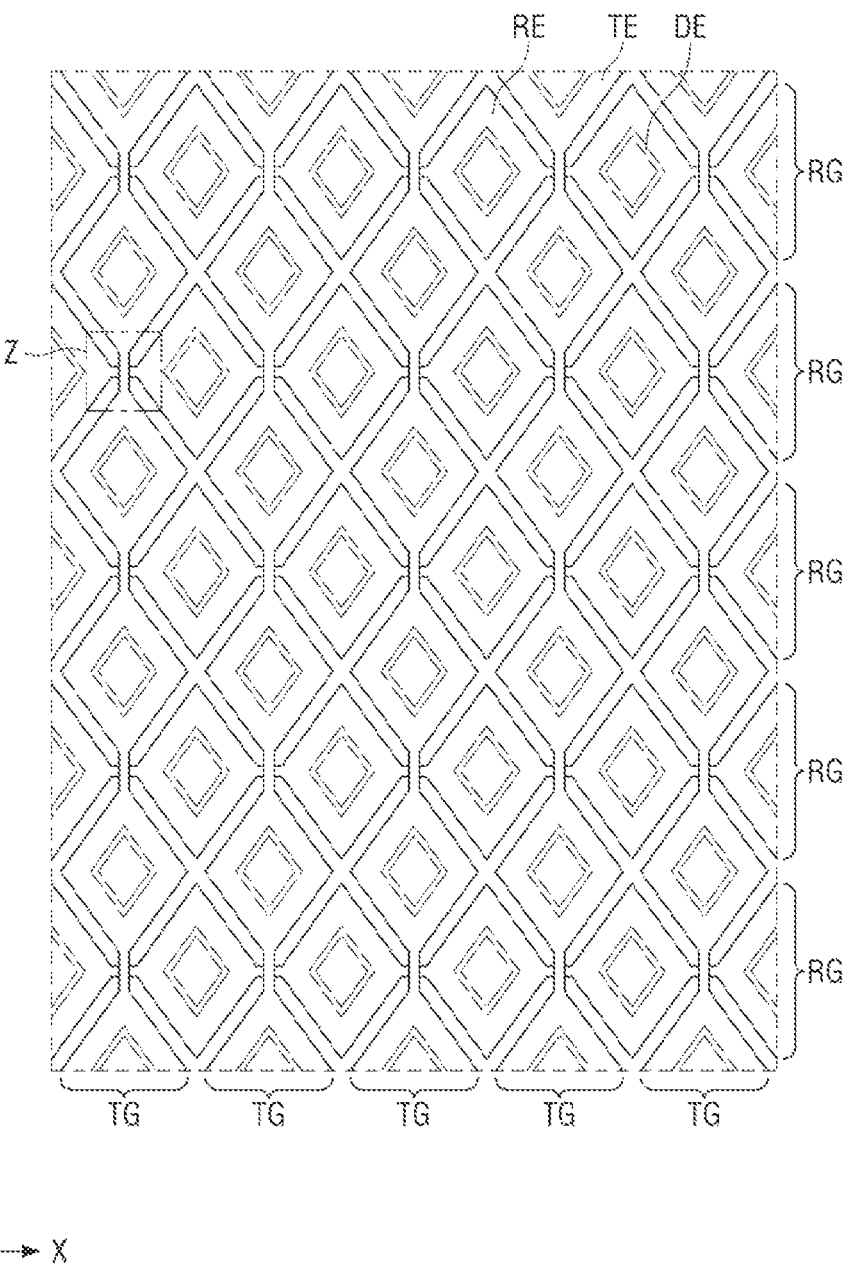
FIG. 9 is a layout diagram illustrating an example of the display area of FIG. 1.

FIG. 9 is a layout diagram illustrating an example of the display area of FIG. 1.

When referring to FIG. 9, it has been mainly described that sensor electrodes SE of the sensor electrode layer SENL include two types of electrodes, for example, driving electrodes TE and sensing electrodes RE, and are driven via a mutual capacitance method for sensing the voltage charged in the mutual capacitance through the sensing electrodes RE after applying a driving signal to the driving electrodes TE. However, embodiments of the present disclosure are not limited thereto. In FIG. 9, only the sensor electrodes TE and RE and the dummy pattern DE are illustrated for convenience of description.

Referring to FIG. 9, the display area DA may include the sensor electrodes SE and dummy patterns DE. The sensor electrodes SE may be electrodes that form mutual capacitance to sense a touch of an object or a person.

The sensor electrodes SE may include driving electrodes TE and sensing electrodes RE. The sensing electrode RE may be defined as a first sensor electrode, and the driving electrode TE may be defined as a second sensor electrode. In this case, the sensing line connected to the sensing electrodes RE may be defined as a first sensor line, and the driving line connected to the driving electrodes TE may be defined as the second sensor line. Alternatively, the driving electrode TE may be defined as the first sensor electrode, and the sensing electrode RE may be defined as the second sensor electrode. In this case, the driving line may be defined as the first sensor line, and the sensing line may be defined as the second sensor line.

The display area DA may include a plurality of sensing electrode groups RG and a plurality of driving electrode groups TG.

The plurality of sensing electrode groups RG may extend in the first direction (X-axis direction) and may be arranged in the second direction (Y-axis direction). Each of the plurality of sensing electrode groups RG may include the plurality of sensing electrodes RE. In each of the plurality of sensing electrode groups RG, the plurality of sensing electrodes RE may be arranged in the first direction (X-axis direction). In each of the plurality of sensing electrode groups RG, the plurality of sensing electrodes RE may be electrically connected in the first direction (X-axis direction). That is, the sensing electrodes RE adjacent in the first direction (X-axis direction) may be connected to each other, but the sensing electrodes RE adjacent in the second direction (Y-axis direction) may be electrically separated from each other.

The plurality of driving electrode groups TG may extend in the second direction (Y-axis direction) and may be arranged in the first direction (X-axis direction). Each of the plurality of driving electrode groups TG may include a plurality of driving electrodes TE. In each of the plurality of driving electrode groups TG, the plurality of driving electrodes TE may be arranged in the second direction (Y-axis direction). In each of the plurality of driving electrode groups TG, the plurality of driving electrodes TE may be electrically connected in the second direction (Y-axis direction). That is, the driving electrodes TE adjacent in the second direction (Y-axis direction) may be connected to each other, but the sensing electrodes RE adjacent in the first direction (X-axis direction) may be electrically separated from each other.

Each of the dummy patterns DE may be surrounded by the driving electrode TE or the sensing electrode RE. Each of the dummy patterns DE may be electrically separated from the driving electrode TE or the sensing electrode RE. Each of the dummy patterns DE may be disposed apart from the driving electrode TE or the sensing electrode RE. Each of the dummy patterns DE may be electrically floating.

FIG. 9 illustrates that each of the driving electrodes TE, the sensing electrodes RE, and the dummy patterns DE has a rhombus planar shape. However, the shape thereof is not limited thereto. For example, each of the driving electrodes TE, the sensing electrodes RE, and the dummy patterns DE may have a flat shape other than a rhombus, a polygon other than a square, a circle, or an ellipse.

The plurality of sensing electrode groups RG may be one-to-one connected to the sensing lines. That is, the plurality of sensing electrode groups RG and the sensing lines may be connected in a one-to-one correspondence. For example, each of the plurality of sensing electrode groups RG may be connected to the sensing line at the right end or the left end. The sensing lines may be connected to some of the display pads DPD of the sub area SBA. Therefore, the sensing lines may be electrically connected to the touch driving circuit 330 through some of the display pads DPD and the display circuit board 310.

The plurality of driving electrode groups TG may be one-to-one connected to the driving lines. That is, the plurality of driving electrode groups TG may be connected to the driving lines in a one-to-one correspondence. For example, each of the plurality of driving electrode groups TG may be connected to the driving line at the lower end and/or the upper end. The driving lines may be connected to some other display pads DPD among the display pads DPD of the sub area SBA. Therefore, the sensing lines may be electrically connected to the touch driving circuit 330 through the other display pads DPD and the display circuit board 310.

Figure 10:
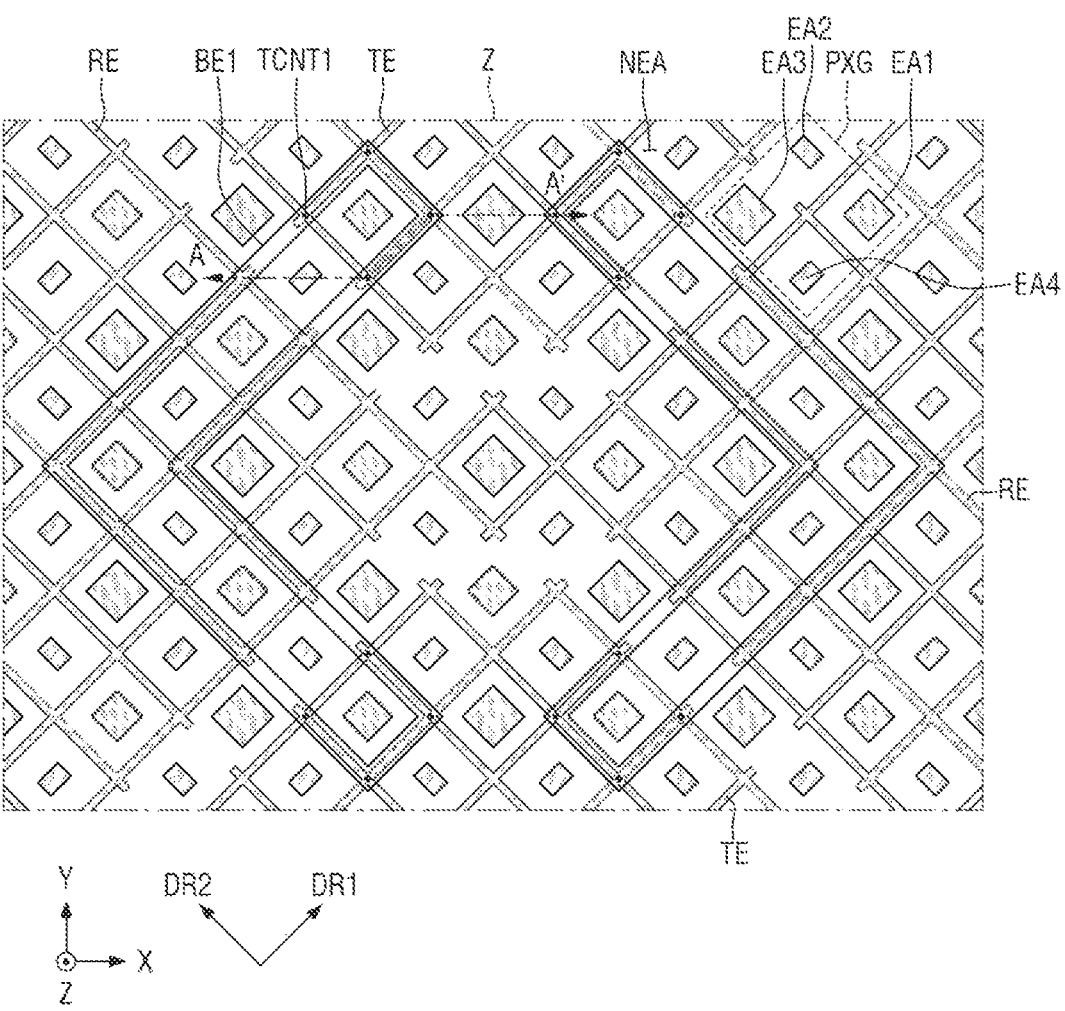
FIG. 10 is a layout diagram illustrating the area Z of FIG. 9 in detail according to one or more embodiments.

FIG. 10 is a layout diagram illustrating the area Z of FIG. 9 in detail according to one or more embodiments.

Referring to FIG. 10, since the driving electrodes TE, the sensing electrodes RE, and the dummy patterns DE are disposed on the same layer, these components may be disposed apart from each other. That is, a gap may be formed between the driving electrode TE and the sensing electrode RE. Also, a gap may be formed between the driving electrode TE and the dummy pattern DE and between the sensing electrode RE and the dummy pattern DE.

First connection parts BE1 may be disposed on a different layer from the driving electrodes TE and the sensing electrodes RE. The first connection part BE1 may overlap two driving electrodes TE and one sensing electrode RE in the third direction (Z-axis direction). The two driving electrodes TE may be driving electrodes TE adjacent to each other in the second direction (Y-axis direction).

The driving electrodes TE adjacent in the second direction (Y-axis direction) may be connected to each other through at least one first connection part BE1. One side of the first connection part BE1 may be connected to one of the driving electrodes TE adjacent in the second direction (the Y-axis direction) through a first touch contact holes TCNT1. The other side of the first connection part BE1 may be connected to another driving electrode TE among the driving electrodes TE adjacent in the second direction (Y-axis direction) through the first touch contact holes TCNT1.

The first connection part BE1 may be bent at least once. In FIG. 5, the first connection part BE1 has a bracket shape ("<" or ">"), but the planar shape of the first connection part BE1 is not limited thereto. Since the driving electrodes TE adjacent to each other in the second direction (Y-axis direction) are connected by the plurality of first connection parts BE1, the driving electrodes TE adjacent to each other in the second direction (Y-axis direction) may be stably connected by the other one even if any one of the first connection parts BE1 is disconnected. FIG. 5 illustrates that the driving electrodes TE adjacent to each other are connected by the two first connection parts BE1, but the number of the first connection parts BE1 is not limited thereto.

The driving electrodes TE and the sensing electrodes RE may be electrically separated at their intersections due to the first connection parts BE1. Accordingly, mutual capacitance may be formed between the driving electrodes TE and the sensing electrodes RE.

Each of the driving electrodes TE, the sensing electrodes RE, and the first connection parts BE1 may be formed in a planar mesh structure or a mesh structure. In addition, each of the dummy patterns DE may also be formed in a planar mesh structure or a mesh structure. For this reason, according to one or more embodiments, each of the driving electrodes TE, the sensing electrodes RE, the first connection parts BE1, and the dummy patterns DE do not overlap the emitting areas EA1, EA2, and EA3. Therefore, light emitted from the light emitting areas EA1, EA2, and EA3 is blocked by the driving electrodes TE, the sensing electrodes RE, the first connection parts BE1, and the dummy patterns DE. Accordingly, luminance may be prevented from being reduced.

The light emitting areas EA1, EA2, EA3, and EA4 may include first light emitting areas EA1 that emit light of a first color, second light emitting areas EA2 that emit light of a second color, third light emitting areas EA3 that emit light of a third color, and fourth light emitting areas EA4 that emit light of a fourth color. For example, the first color may be red, the second color and the fourth color may be green, and the third color may be blue. However, embodiments of the present disclosure are not limited thereto.

Each of the first light emitting areas EA1, the second light emitting areas EA2, the third light emitting areas EA3, and the fourth light emitting areas EA4 may have a rhombus planar shape or a rectangular planar shape, but are not limited thereto. Each of the first light emitting areas EA1, the second light emitting areas EA2, the third light emitting areas EA3, and the fourth light emitting areas EA4 may have a polygonal, circular, or elliptical plane other than a quadrangle according to embodiments. Also, as shown in FIG. 10, according to an embodiment, the third light emitting area EA3 has the largest area and the second light emitting area EA2 and the fourth light emitting area EA4 have the smallest area. However, embodiments of the present disclosure are not limited thereto.

The first light emitting area EA1, the second light emitting area EA2, the third light emitting area EA3, and the fourth light emitting area EA4 adjacent to each other may be defined as one pixel group PXG for expressing a white grayscale. That is, a white gradation may be expressed by the combination of the light emitted from the first light emitting area EA1, the light emitted from the second light emitting area EA2, the light emitted from the third light emitting area EA3, and the light emitted from the fourth light emitting area EA4.

The second light emitting areas EA2 and the fourth light emitting areas EA4 may be disposed in odd-numbered rows. The second light emitting areas EA2 and the fourth light emitting areas EA4 may be disposed in the first direction (X-axis direction) in each of the odd-numbered rows. The second light emitting areas EA2 and the fourth light emitting areas EA4 may be alternately disposed in each of the odd-numbered rows. The fourth light emitting area EA4 may have a long side in one direction DR1 and a short side in the other direction DR2, while the second light emitting area EA2 may have a long side in the other direction DR2 and a short side in one direction DR1. The one direction DR1 may be a diagonal direction between the first direction (X-axis direction) and the second direction (Y-axis direction), and the other direction DR2 may be a direction orthogonal to the one direction DR1.

The first light emitting areas EA1 and the third light emitting areas EA3 may be arranged in even rows. The first light emitting areas EA1 and the third light emitting areas EA3 may be disposed in the first direction (X-axis direction) in each of the even-numbered rows. The first light emitting areas EA1 and the third light emitting areas EA3 may be alternately disposed in each of the even-numbered rows.

The second light emitting areas EA2 and the fourth light emitting areas EA4 may be arranged in odd-numbered columns. The second light emitting areas EA2 and the fourth light emitting areas EA4 may be disposed in the second direction (Y-axis direction) in each of the odd-numbered columns. The second light emitting areas EA2 and the fourth light emitting areas EA4 may be alternately disposed in each of odd-numbered columns.

The first light emitting areas EA1 and the third light emitting areas EA3 may be arranged in even-numbered columns. The first light emitting areas EA1 and the third light emitting areas EA3 may be disposed in the second direction (Y-axis direction) in each of the even-numbered columns. The first light emitting areas EA1 and the third light emitting areas EA3 may be alternately disposed in each of the even-numbered columns.

Figure 11:
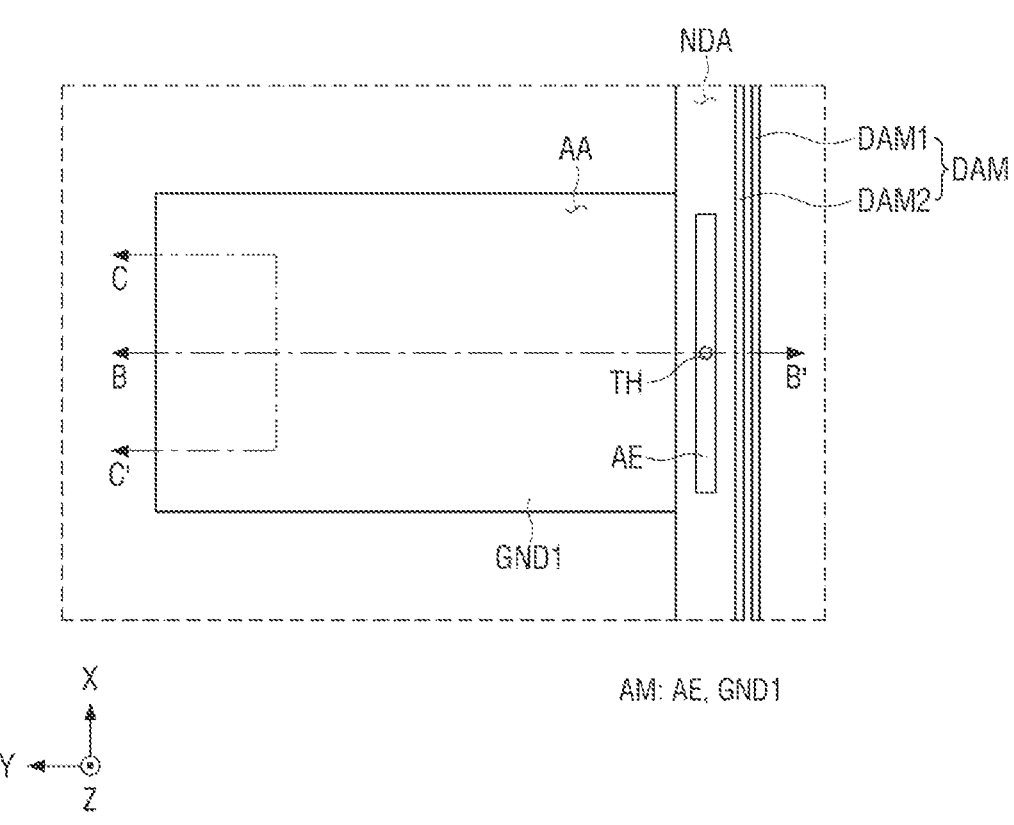
FIG. 11 is a plan view illustrating an example of the antenna area of FIG. 1.
Figure 12:
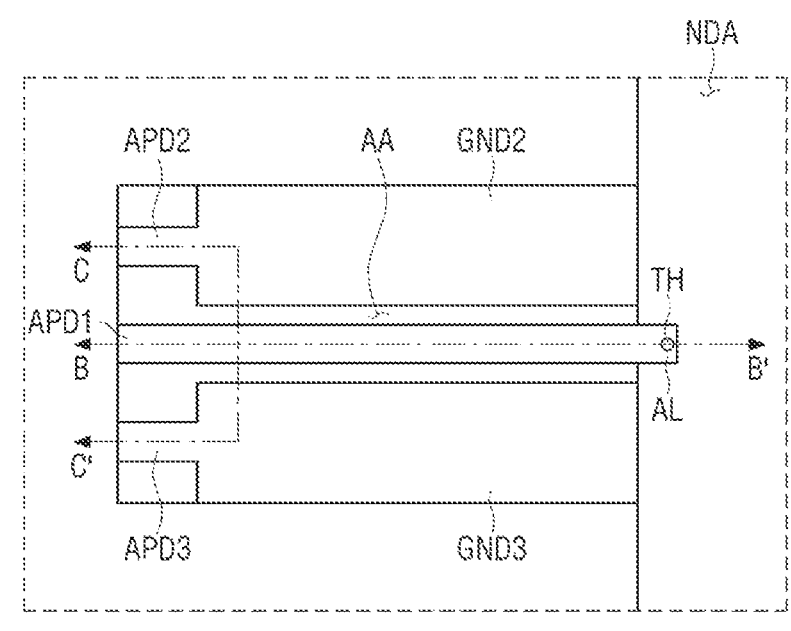
FIG. 12 is a bottom view illustrating an example of the antenna area of FIG. 1.
Figure 12:
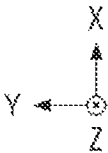

FIG. 11 is a plan view illustrating an example of the antenna area of FIG. 1. FIG. 12 is a bottom view illustrating an example of the antenna area of FIG. 1.

Referring to FIGS. 11 and 12, an antenna module AM may include an antenna electrode AE, a feed line AL, a first electrode GND1, a second electrode GND2, a third electrode GND3, a first antenna pad APD1, a second antenna pad APD2, and a third antenna pad APD3 according to one or more embodiments.

The antenna electrode AE may be disposed on the upper surface of the substrate SUB. The antenna electrode AE may be disposed in the non-display area NDA of the main area MA. The antenna electrode AE may be disposed outside the dam DAM in the non-display area NDA. That is, the antenna electrode AE may be disposed between the edge of the dam DAM and the substrate SUB in the non-display area NDA. The dam DAM may include a first dam DAM1 and a second dam DAM2 disposed closer to the edge of the substrate SUB than the first dam DAM1. The dam DAM may surround the display area DA.

An extension direction of the antenna electrode AE may intersect an extension direction of the antenna area AA. The antenna electrode AE has a rectangular planar shape and may be a patch antenna electrode implemented as a patch antenna. For example, when the antenna area AA protrudes from the upper side of the main area MA as shown in FIGS. 1 and 2, the antenna electrode AE may have a rectangular planar shape having a long side in the first direction (X-axis direction) and a short side in the second direction (Y-axis direction). That is, the antenna electrode AE may extend in the first direction (X-axis direction). Alternatively, when the antenna area AA protrudes from the left side of the main area MA as shown in FIGS. 5 and 6 or from the right side of the main area MA as shown in FIGS. 7 and 8, the antenna electrode AE may have a rectangular planar shape having a long side in the second direction (Y-axis direction) and a short side in the first direction (X-axis direction). That is, the antenna electrode AE may extend in the second direction (Y-axis direction).

The length in the first direction (X-axis direction) of the antenna electrode AE may depend on the frequency of the electromagnetic wave to be transmitted and received using the antenna electrode AE. For example, the length of the antenna electrode AE in the first direction (X-axis direction) may be designed to have a resonance length of half ($\lambda$g/2) of the in-pipe wavelength of the feed line AL. In this case, when the frequency of the electromagnetic wave to be transmitted and received using the antenna electrode AE is about 60 GHz, the length of the antenna electrode AE in the first direction (X-axis direction) may be about 2 mm.

The length in the second direction (Y-axis direction) of the antenna electrode AE may be smaller than a distance between the dam DAM from the boundary between the non-display area NDA and the antenna area AA. Referring to an example, the distance between the dam DAM from the boundary between the non-display area NDA and the antenna area AA may be about 300 $\mu$m. As a result, the size of the bezel may be reduced. In this case, the length in the second direction (Y-axis direction) of the antenna electrode AE may be about 300 $\mu$m or less.

The first electrode GND1 may be disposed on the upper surface of the substrate SUB. The first electrode GND1 may be disposed in the antenna area AA. The first electrode GND1 may be disposed throughout the antenna area AA as shown in FIG. 11. However, embodiments of the present disclosure are not limited thereto. A ground voltage may be applied to the first electrode GND1.

Since the antenna electrode AE and the first electrode GND1 are formed by the same process, they may be formed of the same material according to one or more embodiments.

The feed line AL may be disposed on the lower surface of the substrate SUB. The feed line AL may be disposed in the antenna area AA and the non-display area NDA of the main area MA.

The feed line AL may overlap the first electrode GND1 in the third direction (Z-axis direction) in the antenna area AA. The feed line AL may overlap the antenna electrode AE in the third direction (Z-axis direction) in the non-display area NDA of the main area MA.

An extension direction of the feed line AL may be the same as an extension direction of the antenna area AA. For example, when the antenna area AA protrudes from the upper side of the main area MA as shown in FIGS. 1 and 2, the feed line AL may extend in the second direction (Y-axis direction). Alternatively, when the antenna area AA protrudes from the left side of the main area MA as shown in FIGS. 5 and 6 or from the right side of the main area MA as shown in FIGS. 7 and 8, the feed line AL may extend in a first direction (X-axis direction).

The antenna electrode AE may be connected to the feed line AL through a through hole TH. The through hole TH may be a hole passing through the substrate SUB. A separate antenna connection electrode may be additionally disposed in the through hole TH. Alternatively, the antenna electrode AE or the feed line AL may be disposed in the through hole TH.

The through hole TH may have a circular or elliptical planar shape. Considering the length of the antenna electrode AE in the second direction (the Y-axis direction), the radius of the through hole TH may be about 0.1 mm when the through hole TH has a circular planar shape according to one or more embodiments.

The second electrode GND2 and the third electrode GND3 may be disposed on the lower surface of the substrate SUB. The second electrode GND2 and the third electrode GND3 may be disposed in the antenna area AA.

The second electrode GND2 may be disposed on one side of the feed line AL and the third electrode GND3 may be disposed on the other side of the feed line AL, that is, on the opposite side of the feed line AL. The second electrode GND2 and the third electrode GND3 may be disposed apart from the feed line AL. A ground voltage may be applied to the second electrode GND2 and the third electrode GND3.

The area of the second electrode GND2 and the area of the third electrode GND3 may be substantially the same. An area of the second electrode GND2 and an area of the third electrode GND3 may be larger than an area of the feed line AL.

The length of the feed line AL in the second direction (Y-axis direction) may be longer than the maximum length in the second direction (Y-axis direction) of the second electrode GND2 and the maximum length in the second direction (Y-axis direction) of the third electrode GND3. The maximum length of the feed line AL in the first direction (X-axis direction) may be longer than the maximum length in the first direction (X-axis direction) of the second electrode GND2 and the maximum length in the first direction (X-axis direction) of the third electrode GND3.

Due to the first electrode GND1, the second electrode GND2, and the third electrode GND3, the feed line AL may have a ground coplanar wave guide (GCPW) structure.

The first antenna pad APD1, the second antenna pad APD2, and the third antenna pad APD3 may be disposed on the lower surface of the substrate SUB. The first antenna pad APD1, the second antenna pad APD2, and the third antenna pad APD3 may be disposed at one edge of the antenna area AA.

The first antenna pad APD1 may be connected to one end of the feed line AL. The first antenna pad APD1 may be integrally formed with the feed line AL.

The second antenna pad APD2 may be connected to one end of the second electrode GND2. The second antenna pad APD2 may be integrally formed with the second electrode GND2.

The third antenna pad APD3 may be connected to one end of the third electrode GND3. The third antenna pad APD3 may be integrally formed with the third electrode GND3.

The first antenna pad APD1, the second antenna pad APD2, and the third antenna pad APD3 may be connected to the antenna circuit board 340 using the conductive adhesive member such as the anisotropic conductive film and the anisotropic conductive adhesive.

According to one or more embodiments, the first electrode GND1 may also be connected to the antenna pad, and in this case, the first electrode GND1 may be connected to the antenna circuit board 340 using the anisotropic conductive film including a conductive ball CB and the conductive adhesive member (see CAM of FIG. 15) such as the anisotropic conductive adhesive.

As shown FIGS. 11 and 12, the antenna module AM is formed in the antenna area AA protruding from one side of the main area MA of the display panel 300 and the non-display area NDA of the main area MA adjacent to the antenna area AA. The antenna area AA is bent under the display panel 300, and only the antenna electrode AE is formed outside the dam DAM in the non-display area NDA of the main area MA as shown in FIGS. 2, 4, 6, and 8. Accordingly, there is no need to provide a separate space in the display panel 300 for the antenna module AM according to one or more embodiments.

Figure 13:
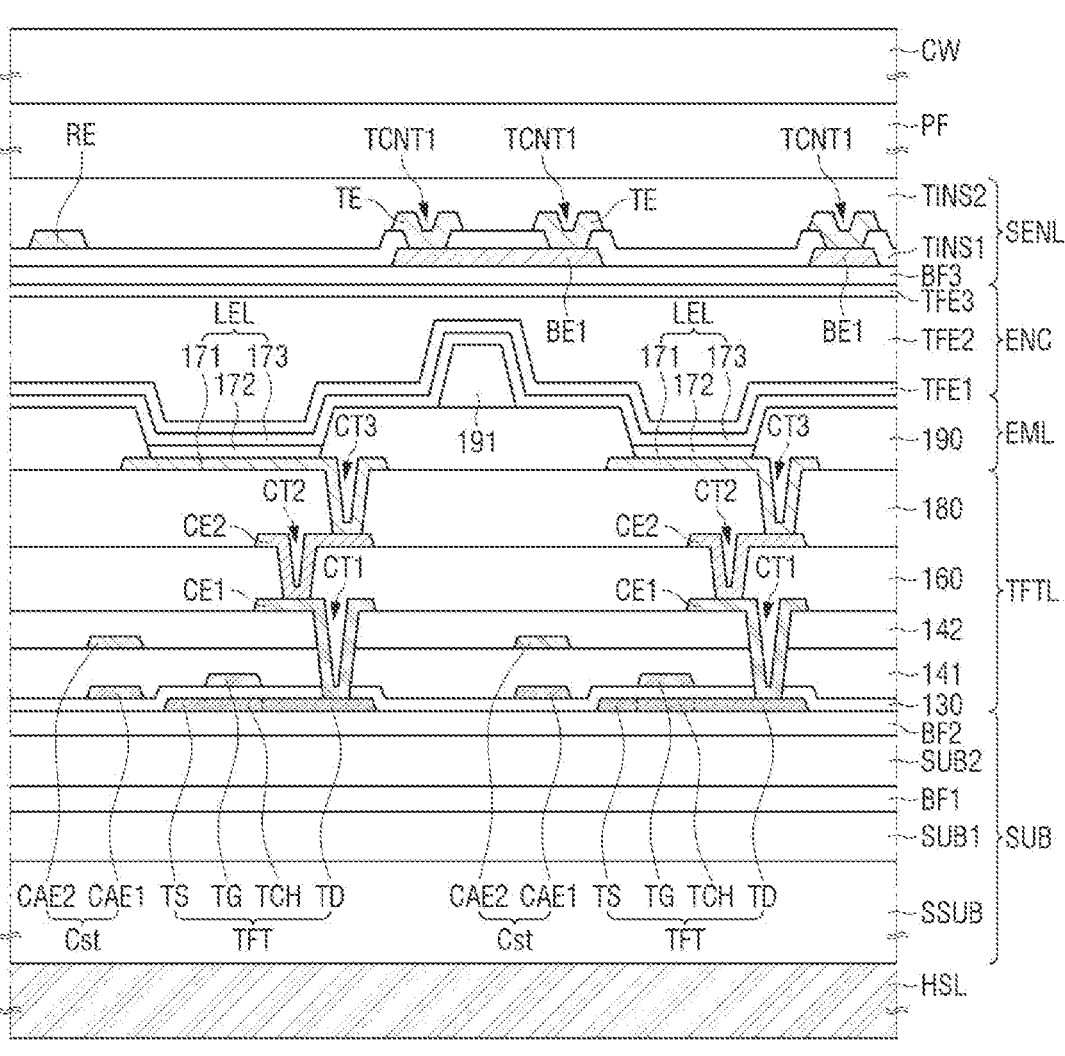
FIG. 13 is a cross-sectional view illustrating an example of the display device taken along line A-A' of FIG. 10.
Figure 13:
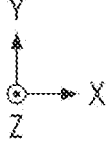

FIG. 13 is a cross-sectional view illustrating an example of the display device taken along line A-A' of FIG. 10.

Referring to FIG. 13, the display layer DISL including a thin film transistor layer TFTL and a light emitting element layer EML may be disposed on one surface of a substrate SUB, an encapsulation layer ENC may be disposed on the display layer DISL, and the sensor electrode layer SENL including the sensor electrodes SE may be disposed on the encapsulation layer ENC. The polarizing film PF may be disposed on the sensor electrode layer SENL, and the cover window CW may be disposed on the polarizing film PF.

The substrate SUB may include a support substrate SSUB, a first substrate SUB1, a first buffer layer BF1, a second substrate SUB2, and a second buffer layer BF2. The first substrate SUB1 may be disposed on the support substrate SSUB, the first buffer layer BF1 may be disposed on the first substrate SUB1, the second substrate SUB2 may be disposed on the first buffer layer BF1, and the second buffer layer BF2 may be disposed on the second substrate SUB2.

The support substrate SSUB may be a rigid substrate for supporting the flexible first substrate SUB1 and the second substrate SUB2. The support substrate SSUB may be formed of, for example, glass or a plastic material such as polycarbonate (PC) and polyethylene terephthalate (PET).

The first substrate SUB1 and the second substrate SUB2 may be formed of an organic material such as, for example, acrylic resin, epoxy resin, phenolic resin, polyamide resin, and polyimide resin. The first substrate SUB1 and the second substrate SUB2 may be formed of the same organic material or may be formed of different organic materials.

Each of the first buffer layer BF1 and the second buffer layer BF2 may be formed of an inorganic material such as, for example, a silicon nitride layer, a silicon oxynitride layer, a silicon oxide layer, a titanium oxide layer, and an aluminum oxide layer. Alternatively, each of the first buffer layer BF1 and the second buffer layer BF2 may be formed as a multilayer in which a plurality of layers of a silicon nitride layer, a silicon oxynitride layer, a silicon oxide layer, a titanium oxide layer, and an aluminum oxide layer are alternately stacked. The first buffer layer BF1 and the second buffer layer BF2 may be formed of the same inorganic material or different inorganic materials.

An active layer ACT including a channel area TCH, a source area TS, and a drain area TD of a thin film transistor TFT may be disposed on the second buffer layer BF2. The active layer ACT may include, for example, polycrystalline silicon, single crystal silicon, low-temperature polycrystalline silicon, amorphous silicon, or an oxide semiconductor material. When the active layer ACT includes polycrystalline silicon or an oxide semiconductor material, the source area TS and the drain area TD of the active layer ACT may be conductive areas doped with ions to have conductivity.

A gate insulating layer 130 may be formed on the active layer ACT of the thin film transistor TFT. The gate insulating layer 130 may be formed of an inorganic layer, for example, a silicon nitride layer, a silicon oxynitride layer, a silicon oxide layer, a titanium oxide layer, or an aluminum oxide layer.

A gate electrode TG and a first capacitor electrode CAE1 of the thin film transistor TFT may be disposed on the gate insulating layer 130. The gate electrode TG of the thin film transistor TFT may overlap the channel area TCH in the third direction (Z-axis direction). The gate electrode TG and the first capacitor electrode CAE1 may be formed as a single layer or multiple layers made of any one of, for example, molybdenum (Mo), aluminum (Al), chromium (Cr), gold (Au), titanium (Ti), nickel (Ni), neodymium (Nd), and copper (Cu) or an alloy thereof.

A first interlayer insulating layer 141 may be disposed on the gate electrode TG and the first capacitor electrode CAE1. The first interlayer insulating layer 141 may be formed of the inorganic layer, for example, the silicon nitride layer, the silicon oxynitride layer, the silicon oxide layer, the titanium oxide layer, or the aluminum oxide layer. The first interlayer insulating layer 141 may include a plurality of inorganic layers.

A second capacitor electrode CAE2 may be disposed on the first interlayer insulating layer 141. The second capacitor electrode CAE2 may overlap the first capacitor electrode CAE1 in the third direction (Z-axis direction). Therefore, the capacitor Cst may be formed of an inorganic insulating dielectric layer serving as a dielectric layer disposed between the first capacitor electrode CAE1 and the second capacitor electrode CAE2. The second capacitor electrode CAE2 may be formed as a single layer or multiple layers made of any one of, for example, molybdenum (Mo), aluminum (Al), chromium (Cr), gold (Au), titanium (Ti), nickel (Ni), neodymium (Nd), and copper (Cu) or an alloy thereof.

A second interlayer insulating layer 142 may be disposed on the second capacitor electrode CAE2. The second interlayer insulating layer 142 may be formed of the inorganic layer, for example, the silicon nitride layer, the silicon oxynitride layer, the silicon oxide layer, the titanium oxide layer, or the aluminum oxide layer. The second interlayer insulating layer 142 may include the plurality of inorganic layers.

A first connection electrode CE1 may be disposed on the second interlayer insulating layer 142. The first connection electrode CE1 may be connected to the drain area TD through a first contact hole CT1 penetrating the gate insulating layer 130, the first interlayer insulating layer 141, and the second interlayer insulating layer 142. The first connection electrode CE1 may be formed as a single layer or multiple layers made of any one of, for example, molybdenum (Mo), aluminum (Al), chromium (Cr), gold (Au), titanium (Ti), nickel (Ni), neodymium (Nd), and copper (Cu) or an alloy thereof.

A first organic layer 160 for flattening a step caused by the thin film transistors TFT may be disposed on the first connection electrode CE1. The first organic layer 160 may be formed of the organic layer such as, for example, acrylic resin, epoxy resin, phenolic resin, polyamide resin, polyimide resin, etc.

A second connection electrode CE2 may be disposed on the first organic layer 160. The second connection electrode CE2 may be connected to the first connection electrode CE1 through a second contact hole CT2 penetrating the first organic layer 160. The second connection electrode CE2 may be formed as a single layer or multiple layers made of any one of, for example, molybdenum (Mo), aluminum (Al), chromium (Cr), gold (Au), titanium (Ti), nickel (Ni), neodymium (Nd), and copper (Cu) or an alloy thereof.

A second organic layer 180 may be disposed on the second connection electrode CE2. The second organic layer 180 may be formed of the organic layer such as, for example, acrylic resin, epoxy resin, phenolic resin, polyamide resin, polyimide resin, etc.

The light emitting element layer EML is disposed on the thin film transistor layer TFTL. The light emitting element layer EML may include light emitting elements LEL and a bank 190.

Each of the light emitting elements LEL may include a pixel electrode 171, a light emitting layer 172, and a common electrode 173. Each of the light emitting areas EA1, EA2, EA3, and EA4 represents an area where holes from the pixel electrode 171 and electrons from the common electrode 173 are combined with each other in the light emitting layer 172 to emit light by sequentially stacking the pixel electrode 171, the light emitting layer 172, and the common electrode 173. In this case, the pixel electrode 171 may be an anode electrode and the common electrode 173 may be a cathode electrode.

The pixel electrode 171 may be formed on the second organic layer 180. The pixel electrode 171 may be connected to a first connection electrode ANDE1 through a third contact hole CT3 penetrating the second organic layer 180.

In a top emission structure that emits light in the direction of the common electrode 173 based on the light emitting layer 172, the pixel electrode 171 may be formed of a single layer of, for example, molybdenum (Mo), titanium (Ti), copper (Cu), or aluminum (Al), or may be formed of, for example, a stacked structure of aluminum and titanium (Ti/Al/Ti), a stacked structure of aluminum and ITO (ITO/Al/ITO), an APC alloy, and a stacked structure of APC alloy and ITO (ITO/APC/ITO) to increase reflectivity. The APC alloy is an alloy of silver (Ag), palladium (Pd), and copper (Cu).

The bank 190 serves to define the emitting areas EA1, EA2, EA3, and EA4 of the display pixels. To this end, the bank 190 may be formed to expose a partial area of the pixel electrode 171 on the second organic layer 180. The bank 190 may cover the edge of the pixel electrode 171. The bank 190 may be disposed in a contact hole penetrating the second organic layer 180. Accordingly, the third contact hole CT3 passing through the second organic layer 180 may be filled by the bank 190. The bank 190 may be formed of an organic layer such as, for example, an acrylic resin, an epoxy resin, a phenolic resin, a polyamide resin, or a polyimide resin.

A spacer 191 may be disposed on the bank 190. The spacer 191 may serve to support the mask during the process of manufacturing the light emitting layer 172. The spacer 191 may be formed of the organic layer such as, for example, the acrylic resin, the epoxy resin, the phenolic resin, the polyamide resin, or the polyimide resin.

The light emitting layer 172 is formed on the pixel electrode 171. The light emitting layer 172 may include an organic material to emit a predetermined color. For example, the light emitting layer 172 may include a hole transporting layer, an organic material layer, and an electron transporting layer. The organic material layer may include a host and a dopant. The organic material layer may include a material that emits predetermined light and may be formed using, for example, a phosphorescent material or a fluorescent material.

For example, the organic material layer of the light emitting layer 172 of the first light emitting area EA1 that emits light of the first color may include a host material containing CBP (carbazole biphenyl) or mCP (1,3-bis (carbazol-9-yl) and may be a phosphorescent material including a dopant containing at least one of, for example, PIQIr(acac) (bis(1-phenylisoquinoline)acetylacetonate iridium), PQIr (acac)(bis(1-phenylquinoline)acetylacetonate iridium), PQIr (tris(1-phenylquinoline)iridium) and PtOEP (octaethylporphyrin platinum). Alternatively, the organic material layer of the light emitting layer 172 of the first emitting area EA1 may be a fluorescent material including PBD:Eu(DBM)3(Phen) or Perylene, but is not limited thereto.

The organic material layer of the light emitting layer 172 of the second emitting area EA2 and the fourth emitting area EA4 that emits light of the second color includes a host material including CBP or mCP and may be a phosphorescent material including a dopant material containing Ir(ppy) 3(fac tris(2-phenylpyridine)iridium). Alternatively, the organic material layer of the light emitting layer 172 of the second light emitting area EA2 and the fourth light emitting area EA4 that emits light of the second color is a fluorescent material including Alq3(tris(8-hydroxyquinolino)aluminum), but is not limited thereto.

The organic material layer of the light emitting layer 172 of the third emitting area EA3 that emits light of the third color includes a host material including CBP or mCP and may be a phosphorescent material including a dopant material containing (4,6-F2ppy)2Irpic or L2BD111 but is not limited thereto.

The common electrode 173 is formed on the light emitting layer 172. The common electrode 173 may be formed to cover the light emitting layer 172. The common electrode 173 may be a common layer commonly formed in the emitting areas EA1, EA2, EA3, and EA4. A capping layer may be formed on the common electrode 173.

In the upper light emitting structure, the common electrode 173 may be formed of a transparent conductive material (TCO) such as, for example, ITO or IZO that may transmit light, or may be formed of a semi-transmissive conductive material such as, for example, magnesium (Mg), silver (Ag), or an alloy of magnesium (Mg) and silver (Ag). When the common electrode 173 is formed of a transflective metal material, light output efficiency may be increased by the micro cavity.

The encapsulation layer ENC may be formed on the light emitting elements layer EML. The encapsulation layer ENC may include at least one inorganic layer TFE1 and TFE3, which may prevent oxygen or moisture from penetrating into the light emitting element layer EML. Also, the encapsulation layer ENC may include at least one organic layer, which may protect the light emitting element layer EML from foreign substances such as dust. For example, the encapsulation layer ENC may include a first inorganic encapsulation layer TFE1, an organic encapsulation layer TFE2, and a second inorganic encapsulation layer TFE3.

The first encapsulation inorganic layer TFE1 may be disposed on the common electrode 173, the encapsulation organic layer TFE2 may be disposed on the first encapsulation inorganic layer TFE1, and the second encapsulation inorganic layer TFE3 may be disposed on the encapsulation organic layer TFE2. The buffer layer BF may be formed as a multilayer in which one or more inorganic layers of, for example, a silicon nitride layer, a silicon oxynitride layer, a silicon oxide layer, a titanium oxide layer, and an aluminum oxide layer are alternately stacked. The encapsulation organic film TFE2 may be an organic film such as, for example, an acrylic resin, an epoxy resin, a phenolic resin, a polyamide resin, or a polyimide resin.

The sensor electrode layer SENL is disposed on the encapsulation layer ENC. The sensor electrode layer SENL may include the sensor electrodes SE.

A third buffer layer BF3 may be disposed on the encapsulation layer ENC. The third buffer layer BF3 may be a layer having an insulating and optical function. The third buffer layer BF3 may include at least one inorganic layer. For example, the third buffer layer BF3 may be formed as a multilayer in which one or more inorganic layers of a silicon nitride layer, a silicon oxynitride layer, a silicon oxide layer, a titanium oxide layer, and an aluminum oxide layer are alternately stacked. The third buffer layer BF3 may be formed by a lamination process using, for example, a flexible material, a spin coating process using a solution-type material, a slit die coating process, or a deposition process. The third buffer layer BF3 may be omitted according to one or more embodiments.

First connection parts BE1 may be disposed on the third buffer layer BF3. The first connection parts BE1 may be formed of, for example, a single layer of molybdenum (Mo), titanium (Ti), copper (Cu), or aluminum (Al), or may be formed of, for example, a stacked structure of aluminum and titanium (Ti/Al/Ti), a stacked structure of aluminum and ITO (ITO/Al/ITO), an APC alloy, and a stacked structure of APC alloy and ITO (ITO/APC/ITO).

A first sensor insulating layer TINS1 may be disposed on the first connection parts BE1. The first sensor insulating layer TINS1 may be a layer having an insulating and optical function. The first sensor insulating layer TINS1 may be formed of the inorganic layer, for example, the silicon nitride layer, the silicon oxynitride layer, the silicon oxide layer, the titanium oxide layer, or the aluminum oxide layer. The first sensor insulating layer TINS1 may be formed by the lamination process using, for example, the flexible material, the spin coating process using the solution-type material, the slit die coating process, or the deposition process.

The sensor electrodes SE, that is, driving electrodes TE and sensing electrodes RE, may be disposed on the first sensor insulating layer TINS1. In addition, the dummy patterns DE may be disposed on the first sensor insulating layer TINS1. The driving electrodes TE, the sensing electrodes RE, and the dummy patterns DE do not overlap the emitting areas EA1, EA2, EA3, and EA4. The driving electrodes TE, the sensing electrodes RE, and the dummy patterns DE may be formed of a single layer of, for example, molybdenum (Mo), titanium (Ti), copper (Cu), or aluminum (Al), or may be formed of, for example, a stacked structure of aluminum and titanium (Ti/Al/Ti), a stacked structure of aluminum and ITO (ITO/Al/ITO), an APC alloy, and a stacked structure of APC alloy and ITO (ITO/APC/ITO).

A second sensor insulating layer TINS2 may be disposed on the driving electrodes TE, the sensing electrodes RE, and the dummy patterns DE. The second sensor insulating layer TINS2 may be a layer having an insulating and optical function. The second sensor insulating layer TINS2 may include at least one of the inorganic layer and the organic layer. The inorganic layer may be, for example, a silicon nitride layer, a silicon oxynitride layer, a silicon oxide layer, a titanium oxide layer, or an aluminum oxide layer. The organic layer may be, for example, the acrylic resin, the epoxy resin, the phenolic resin, the polyamide resin, or the polyimide resin. The second sensor insulating layer TINS2 may be formed by the lamination process using, for example, the flexible material, the spin coating process using the solution-type material, the slit die coating process, or the deposition process.

The heat dissipation layer HSL of the panel bottom cover PB may be disposed on the lower surface of the support substrate SSUB of the substrate SUB. The heat dissipation layer HSL may be formed of a thin metal film such as, for example, copper, nickel, ferrite, or silver that may shield electromagnetic waves and has excellent thermal conductivity.

Figure 14:
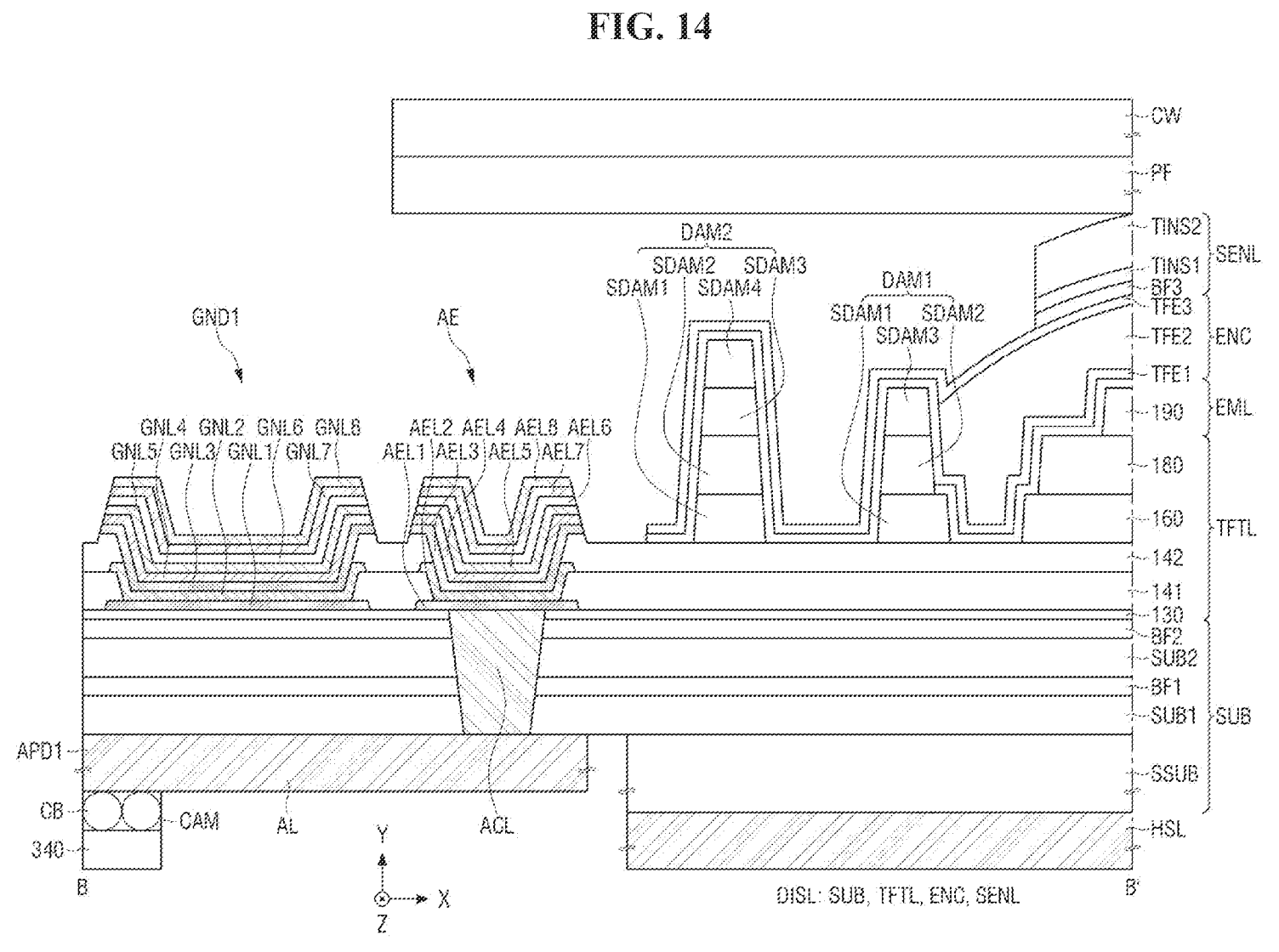
Figure 15:
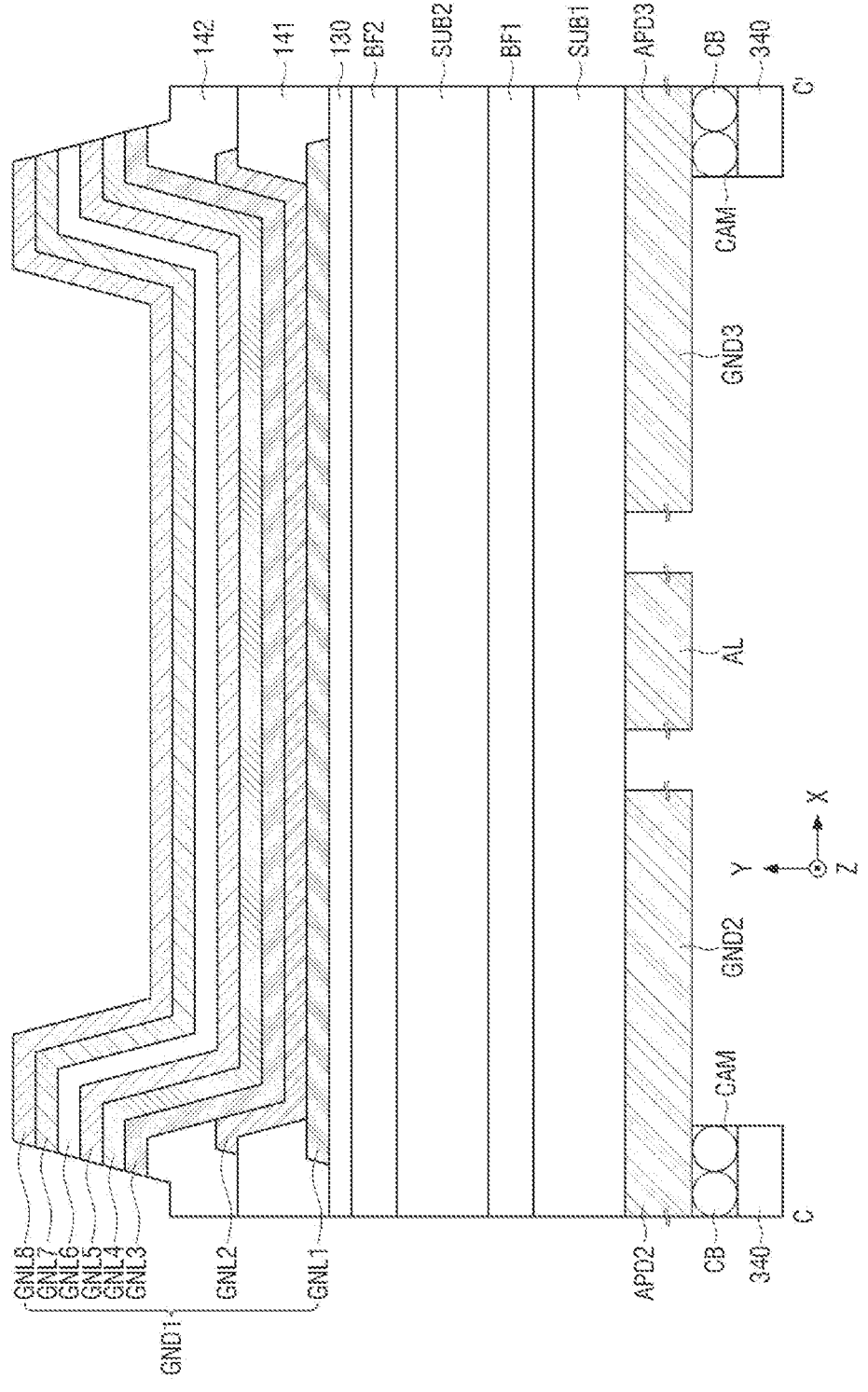
FIG. 15 is a cross-sectional view illustrating an example of the display device taken along line C-C' of FIGS. 11 and 12.

FIG. 14 is a cross-sectional view illustrating an example of the display device taken along line B-B' of FIGS. 11 and 12. FIG. 15 is a cross-sectional view illustrating an example of the display device taken along line C-C' of FIGS. 11 and 12.

Referring to FIGS. 14 and 15, the dam DAM surrounding the display area DA may be disposed in the non-display area NDA of the display panel 300. The dam DAM may prevent an overflow of the organic encapsulation layer TFE2 of the encapsulation layer ENC. The dam DAM may include a first dam DAM1 and a second dam DAM2 disposed outside the first dam DAM1. The first dam DAM1 and the second dam DAM2 may be disposed on the second interlayer insulating layer 142.

The first dam DAM1 may include a first sub-dam SDAM1, a second sub-dam SDAM2, and a third sub-dam SDAM3 that are sequentially stacked. The first sub-dam SDAM1 may be formed of the same material as the first organic layer 160, the second sub-dam SDAM2 may be formed of the same material as the second organic layer 180, and the third sub-dam SDAM3 may be formed of the same material as the bank 190.

The second dam DAM2 may include the first sub-dam SDAM1, the second sub-dam SDAM2, the third sub-dam SDAM3, and a fourth sub-dam SDAM4 that are sequentially stacked. The first sub-dam SDAM1 may be formed of the same material as the first organic layer 160, and the second sub-dam SDAM2 may be formed of the same material as the second organic layer 180. The third sub-dam SDAM3 may be formed of the same material as the bank 190, and the fourth sub-dam SDAM4 may be formed of the same material as the spacer 191.

The antenna electrode AE may include first to eighth antenna electrode layers AEL1 to AEL8. However, embodiments of the present disclosure are not limited thereto. For example, according to one or more embodiments, the antenna electrode AE may include only some antenna electrode layers among the first to eighth antenna electrode layers AEL1 to AEL8.

A first antenna electrode layer AEL1 may be formed by the same process as the gate electrode TG and the first capacitor electrode CAE1 of the thin film transistor TFT and may be formed of the same material.

A second antenna electrode layer AEL2 may be disposed on the exposed first antenna electrode layer AEL1 without being covered by the first interlayer insulating layer 141. The second antenna electrode layer AEL2 may be formed by the same process as the second capacitor electrode CAE2 and may be formed of the same material.

A third antenna electrode layer AEL3 may be disposed on the exposed second antenna electrode layer AEL2 without being covered by the second interlayer insulating layer 142. The third antenna electrode layer AEL3 may be formed by the same process as the first connection electrode CE1 and may be formed of the same material.

A fourth antenna electrode layer AEL4 may be disposed on the third antenna electrode layer AEL3. The fourth antenna electrode layer AEL4 may be formed by the same process as the second connection electrode CE2 and may be formed of the same material.

A fifth antenna electrode layer AEL5 may be disposed on the fourth antenna electrode layer AEL4. The fifth antenna electrode layer AEL5 may be formed by the same process as the pixel electrode 171 and may be formed of the same material.

A sixth antenna electrode layer AEL6 may be disposed on the fifth antenna electrode layer AEL5. The sixth antenna electrode layer AEL6 may be formed by the same process as the common electrode 173 and may be formed of the same material.

A seventh antenna electrode layer AEL7 may be disposed on the sixth antenna electrode layer AEL6. The seventh antenna electrode layer AEL7 may be formed by the same process as the first connection part BE1 of the sensor electrode layer SENL and may be formed of the same material.

An eighth antenna electrode layer AEL8 may be disposed on the seventh antenna electrode layer AEL7. The eighth antenna electrode layer AEL8 may be formed by the same process as the driving electrode TE, the sensing electrode RE, and the dummy pattern DE of the sensor electrode layer SENL and may be formed of the same material.

The first electrode GND1 may include first to eighth electrode layers GNL1 to GNL8. However, embodiments of the present disclosure are not limited thereto. For example, according to one or more embodiments, the first electrode GND1 may include only some electrode layers among the first to eighth electrode layers GNL1 to GNL8.

A first electrode layer GNL1 may be formed by the same process as the gate electrode TG, the first capacitor electrode CAE1, and the first antenna electrode layer AEL1 of the thin film transistor TFT and may be formed of the same material.

A second electrode layer GNL2 may be disposed on the exposed first electrode layer GNL1 without being covered by the first interlayer insulating layer 141. The second electrode layer GNL2 may be formed by the same process as the second capacitor electrode CAE2 and the second antenna electrode layer AEL2 and may be formed of the same material.

A third electrode layer GNL3 may be disposed on the exposed second electrode layer GNL2 without being covered by the second interlayer insulating layer 142. The third electrode layer GNL3 may be formed by the same process as the first connection electrode CE1 and the third antenna electrode layer AEL3 and may be formed of the same material.

A fourth electrode layer GNL4 may be disposed on the third electrode layer GNL3. The fourth electrode layer GNL4 may be formed by the same process as the second connection electrode CE2 and the fourth antenna electrode layer AEL4 and may include the same material.

A fifth electrode layer GNL5 may be disposed on the fourth electrode layer GNL4. The fifth electrode layer GNL5 may be formed by the same process as the pixel electrode 171 and the fifth antenna electrode layer APL5 and may be formed of the same material.

A sixth electrode layer GNL6 may be disposed on the fifth electrode layer GNL5. The sixth electrode layer GNL6 may be formed by the same process as the common electrode 173 and the sixth antenna electrode layer APL6 and may be formed of the same material.

A seventh electrode layer GNL7 may be disposed on the sixth electrode layer GNL6. The seventh electrode layer GNL7 may be formed by the same process as the first connection part BE1 of the sensor electrode layer SENL and the seventh antenna electrode layer APL7 and may be formed of the same material.

An eighth electrode layer GNL8 may be disposed on the seventh electrode layer GNL7. The eighth electrode layer GNL8 may be formed by the same process as the driving electrode TE, the sensing electrode RE, and the dummy pattern DE of the sensor electrode layer SENL, and the eighth antenna electrode layer APL8 and may be formed of the same material.

The through hole TH may pass through the first substrate SUB1, the first buffer layer BF1, the second substrate SUB2, and the second buffer layer BF2 of the substrate SUB. Also, the through hole TH may pass through the gate insulating layer 130.

The antenna electrode AE may be connected to an antenna connection electrode ACE disposed in the through hole TH penetrating the substrate SUB. The antenna connection electrode ACE may contact the first antenna electrode layer AEL1 of the antenna electrode AE and the feed line AL. Therefore, the antenna electrode AE and the feed line AL may be electrically connected to each other by the antenna connection electrode ACE. The antenna connection electrode ACE may be formed of a metal material with high conductivity such as, for example, any one of silver (Ag), molybdenum (Mo), aluminum (Al), chromium (Cr), gold (Au), titanium (Ti), nickel (Ni), neodymium (Nd), and copper (Cu), or an alloy thereof.

The feed line AL, the second electrode GND2, the third electrode GND3, the first antenna pad APD1, the second antenna pad APD2, and the third antenna pad APD3 may be disposed on the lower surface of the first substrate SUB1 of the substrate SUB. Since the antenna area AA is bent and disposed under the main area MA, the support substrate SSUB of the substrate SUB may be removed from the antenna area AA in which the feed line AL is disposed.

The feed line AL, the second electrode GND2, the third electrode GND3, the first antenna pad APD1, the second antenna pad APD2, and the third antenna pad APD3 may be formed of the same material as the heat dissipation layer HSL of the lower panel cover PB. A thickness of the feed line AL, a thickness of the second electrode GND2, a thickness of the third electrode GND3, a thickness of the first antenna pad APD1, a thickness of the second antenna pad APD2, and a thickness of the third antenna pad APD3 may be greater than a thickness of the antenna electrode AE and a thickness of the first electrode GND1. Therefore, the thickness of the feed line AL, the thickness of the second electrode GND2, the thickness of the third electrode GND3, the thickness of the first antenna pad APD1, the thickness of the second antenna pad APD2, and the thickness of the third antenna pad APD3 may be greater than the sum of the thicknesses of the first to eighth antenna electrode layers AEL1 to AEL8 of the antenna electrode AE. In addition, the thickness of the feed line AL, the thickness of the second electrode GND2, the thickness of the third electrode GND3, the thickness of the first antenna pad APD1, the thickness of the second antenna pad APD2, and the thickness of the third antenna pad APD3 may be greater than the sum of the thicknesses of the first to eighth electrode layers GNL1 to GNL8 of the first electrode GND1.

The thickness of the feed line AL, the thickness of the second electrode GND2, the thickness of the third electrode GND3, the thickness of the first antenna pad APD1, the thickness of the second antenna pad APD2, and the thicknesses of the three antenna pads APD3 may be the same each other. The thickness of the antenna electrode AE and the thickness of the first electrode GND1 may be the same each other.

As shown in FIGS. 14 and 15, according to one or more embodiments, there is no need to add a separate process for forming the antenna electrode AE and the first electrode GND1 by forming the first to eighth antenna electrode layers AEL1 to AEL8 of the antenna electrode AE and the first to eighth electrode layers GNL1 to GNL8 of the first electrode GND1 with the same material in the same process as the electrodes of the thin film transistor layer TFTL, the light emitting element layer EML, and the sensor electrode layer SENL.

In addition, according to one or more embodiments, there is no need to add a separate process for forming the feed line AL, the second electrode GND2, the third electrode GND3, the first antenna pad APD1, the second antenna pad APD2, and the third antenna pad APD3 by forming the feed line AL, the second electrode GND2, the third electrode GND3, the first antenna pad APD1, the second antenna pad APD2, and the third antenna pad APD3 with the same material as the heat dissipation layer HSL of the bottom cover PB.

Figure 16:
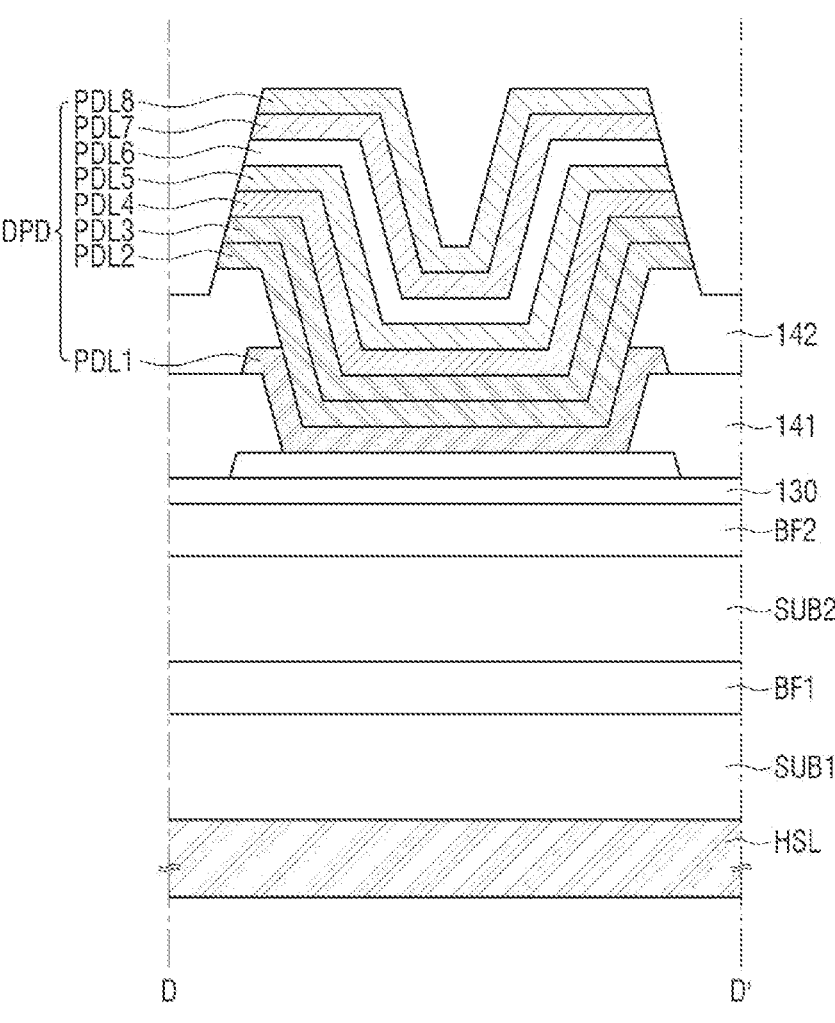
FIG. 16 is a cross-sectional view illustrating an example of the display device taken along line D-D' of FIG. 1.

FIG. 16 is a cross-sectional view illustrating an example of the display device taken along line D-D' of FIG. 1.

Referring to FIG. 16, each of the display pads DPD may include a plurality of pad electrode layers. The plurality of pad electrode layers may be substantially the same as at least some of the first to eighth antenna electrode layers APL1 to APL8 of the antenna electrode AE. Also, the plurality of pad electrode layers may be substantially the same as at least some of the first to eighth electrode layers GNL1 to GNL8 of the first electrode GND1.

In FIG. 16, it is exemplified that each of the display pads DPD includes first to eighth pad electrode layers PDL1 to PDL8 for convenience of explanation. However, embodiments of the present disclosure are not limited thereto. For example, according to one or more embodiments, each of the display pads DPD may include only some pad electrode layers among the first to eighth pad electrode layers PDL1 to PDL8.

A first pad electrode layer PDL1 may be formed by the same process as the gate electrode TG, the first capacitor electrode CAE1, the first antenna electrode layer AEL1, and the first electrode layer GNL1 of the thin film transistor TFT and may be formed of the same material.

A second pad electrode layer PDL2 may be disposed on the exposed first pad electrode layer PDL1 without being covered by the first interlayer insulating layer 141. The second pad electrode layer PDL2 may be formed by the same process as the second capacitor electrode CAE2, the second antenna electrode layer AEL2, and the second electrode layer GNL2 and may be formed of the same material.

A third pad electrode layer PDL3 may be disposed on the exposed second pad electrode layer PDL2 without being covered by the second interlayer insulating layer 142. The third pad electrode layer PDL3 may be formed by the same process as the first connection electrode CE1, the third antenna electrode layer AEL3, and the third electrode layer GNL3 and may be formed of the same material.

A fourth pad electrode layer PDL4 may be disposed on the third pad electrode layer PDL3. The fourth pad electrode layer PDL4 may be formed by the same process as the second connection electrode CE2, the fourth antenna electrode layer AEL4, and the fourth electrode layer GNL4 and may be formed of the same material.

A fifth pad electrode layer PDL5 may be disposed on the fourth pad electrode layer PDL4. The fifth pad electrode layer PDL5 may be formed by the same process as the pixel electrode 171, the fifth antenna electrode layer APL5, and the fifth electrode layer GDL5 and may be formed of the same material.

A sixth pad electrode layer PDL6 may be disposed on the fifth pad electrode layer PDL5. The sixth pad electrode layer PDL6 may be formed by the same process as the common electrode 173, the sixth antenna electrode layer APL6, and the sixth electrode layer GNL6 and may be formed of the same material.

A seventh pad electrode layer PDL7 may be disposed on the sixth pad electrode layer PDL6. The seventh pad electrode layer PDL7 may be formed by the same process as the first connection part BE1 of the sensor electrode layer SENL, the seventh antenna electrode layer APL7, and the seventh electrode layer GNL7 and may be formed of the same material.

An eighth pad electrode layer PDL8 may be disposed on the seventh pad electrode layer PDL7. The eighth pad electrode layer PDL8 may be formed by the same process as the driving electrode TE, the sensing electrode RE, and the dummy pattern DE of the sensor electrode layer SENL, the eighth antenna electrode layer APL8, and the eighth electrode layer GNL8.

As shown in FIG. 16, according to one or more embodiments, there is no need to add the separate process to form the antenna electrode AE and the first electrode GND1 by forming the antenna electrode AE and the first electrode GND1 to be substantially the same as the display pads DPD.

Figure 17:
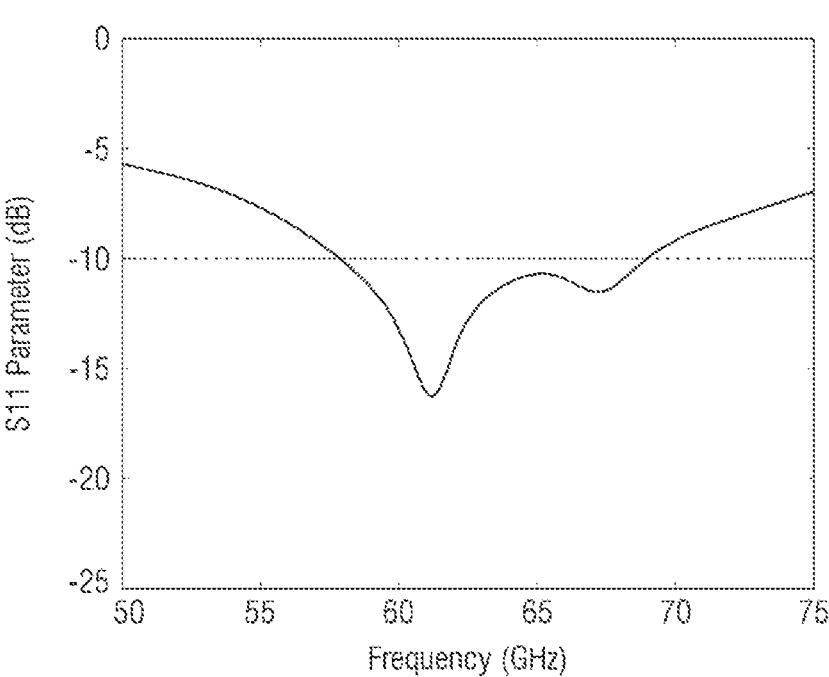
FIG. 17 is a graph illustrating a reflection coefficient of an antenna module according to a frequency of the antenna module according to one or more embodiments.

FIG. 17 is a graph illustrating a reflection coefficient of an antenna module according to a frequency of the antenna module according to one or more embodiments.

In FIG. 17, the X-axis represents frequency (GHz), and the Y-axis represents S11, which is a value representing the ratio of the magnitude of the input signal to the magnitude of the signal that is reflected back of the input signal. S11 is a reflection coefficient of the antenna module AM, and the unit may be dB.

When determining the operation of the antenna module AM, it may be determined based on the case in which the value of S11 has a negative value. When the value of S11 has a negative value, it may mean that the magnitude of the signal returned by reflection of the input signal is smaller than that of the input signal. The smaller the value of S11, the smaller the reflected and returned signal, and the antenna module AM may determine that it operates in a corresponding frequency band.

Referring to FIG. 17, the antenna module AM according to an embodiment has a minimum value of −17 dB at about 61.5 GHz. Therefore, the antenna module AM according to an embodiment may optimally operate at about 61.5 GHz.

Since the frequency band in which the S11 value of the antenna module AM according to an embodiment is −10 dB or less is about 57.9 to about 68.9 GHz, the −10 dB impedance bandwidth of the antenna module AM according to an embodiment may be about 11 GHz. Thus, according to one or more embodiments, the antenna module AM embedded in the display panel 300 has a wide bandwidth.

Figure 18:
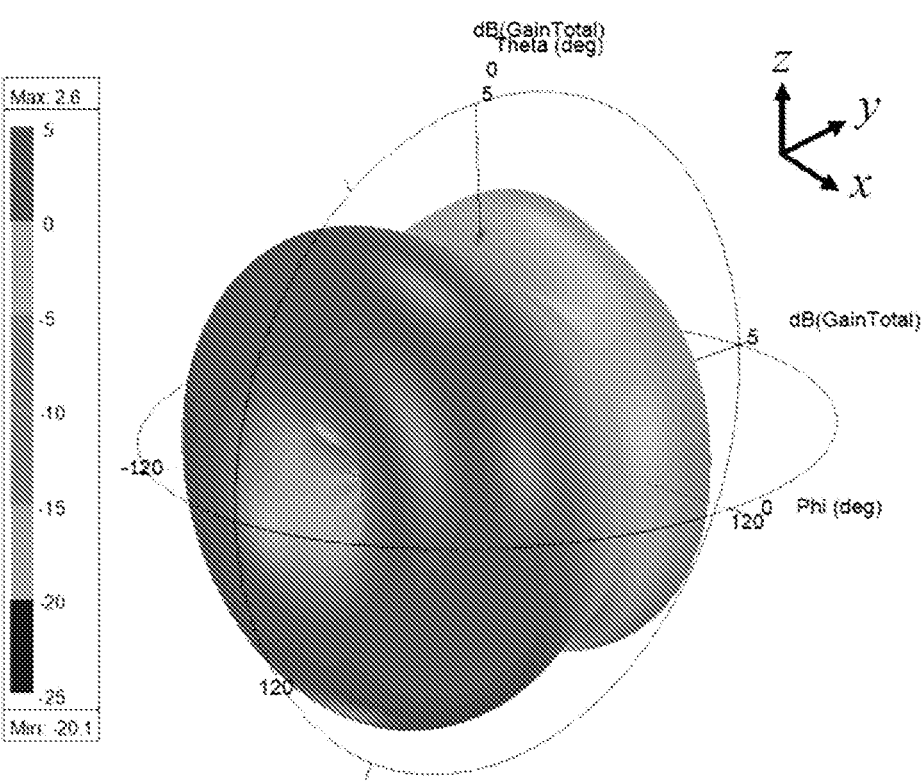
FIG. 18 is a graph illustrating a 3D radiation pattern of an antenna module according to one or more embodiments.

FIG. 18 is a graph illustrating a 3D radiation pattern of an antenna module according to one or more embodiments. FIG. 18 shows a 3D radiation pattern of the antenna module AM according to a frequency signal of about 61.5 GHz.

Referring to FIG. 18, the antenna module AM according to an embodiment has an omni-directional radiation pattern similar to a monopole antenna on a plane formed by an x-axis and a z-axis. The maximum gain of the antenna module AM according to an embodiment is about 2.6 dB at $\theta=45°$ and $\varphi=−45°$. The antenna module AM according to an embodiment shows a radiation efficiency of about 54% at 61.5 GHz. Thus, the antenna module AM embedded in the display panel 300 has a high radiation efficiency according to one or more embodiments.

Figure 19:
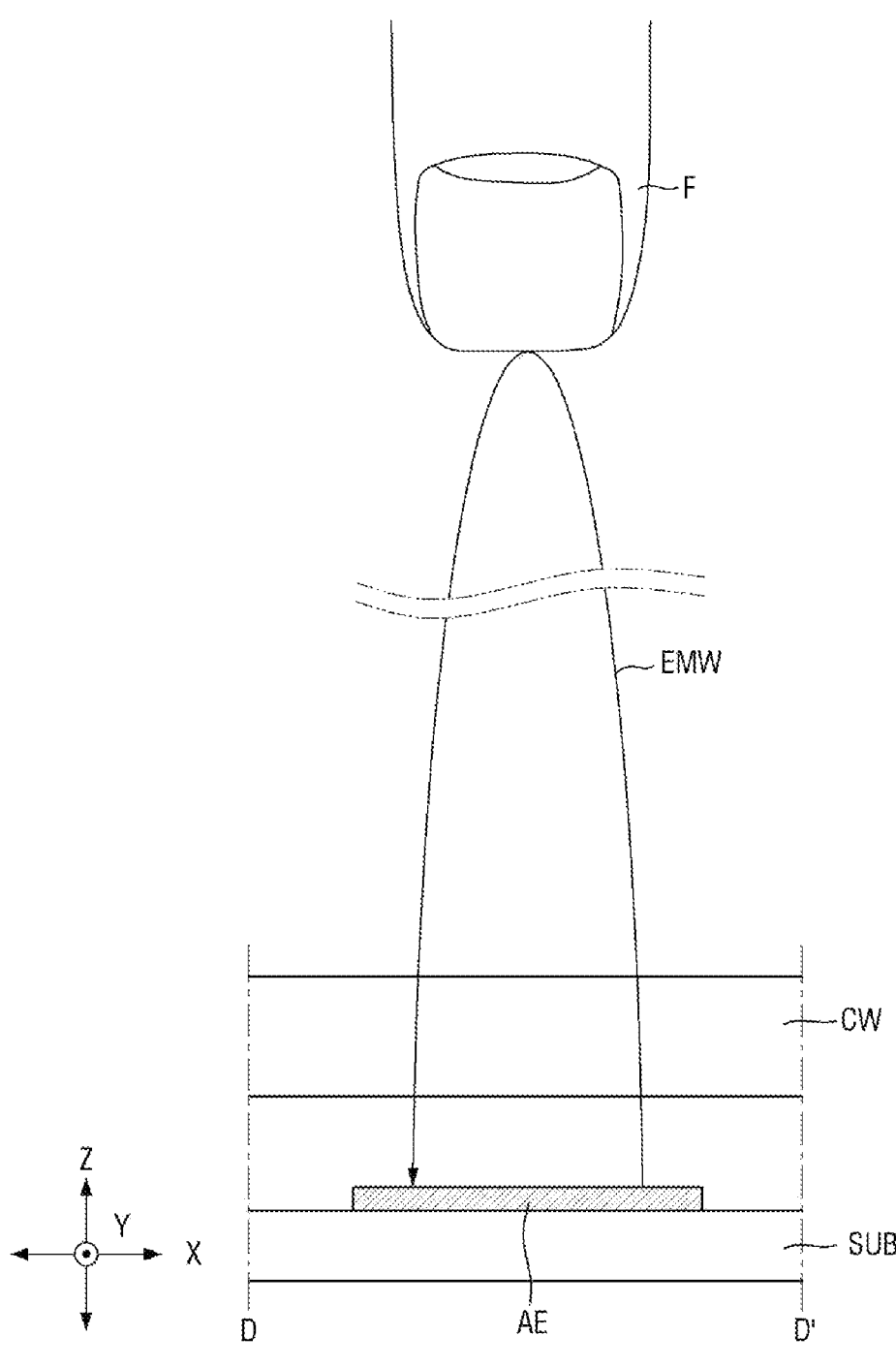
FIG. 19 is an exemplary diagram illustrating proximity touch sensing using an antenna according to one or more embodiments.

FIG. 19 is an exemplary diagram illustrating proximity touch sensing using an antenna according to one or more embodiments. Hereinafter, a method for sensing proximity touch of the antenna module AM will be described in detail with reference to FIG. 19.

Referring to FIG. 19, the antenna driving circuit 350 outputs a transmission signal having a predetermined frequency to the antenna electrode AE through the feed line AL during the first period. According to one or more embodiments, the predetermined frequency may be about 57.9 GHz to about 68.9 GHz. According to one or more embodiments, the predetermined frequency may be about 61.5 GHz. The antenna electrode AE radiates an electromagnetic wave EMW according to the transmission signal during the first period.

When the antenna area AA protrudes in the second direction (Y-axis direction) from the upper side of the main area MA in order for the antenna electrode AE to transmit and receive electromagnetic waves of ultra-high frequency (e.g., millimeter wave (mmWave)) of about 57.9 GHz to about 68.9 GHz as shown in FIGS. 1 and 2, the length of the antenna electrode AE in the first direction (X-axis direction) may be about 2 mm.

The electromagnetic wave EMW radiated from the antenna electrode AE may be reflected from an object such as a finger F or a pen positioned within about 1 m from the cover window CW. The antenna driving circuit 350 may receive a reception signal received from the antenna electrode AE according to the electromagnetic wave EMW reflected from the finger F or the object such as a pen during the second period. That is, the antenna electrode AE may be time-division driven to serve as a transmit electrode for the first period and a receive electrode for the second period.

As illustrated in FIG. 19, a proximity touch such as a gesture detection may be sensed by transmitting and receiving electromagnetic waves EMW having a frequency of an ultra-high frequency (e.g., millimeter wave (mmWave)) using the antenna electrode AE.

Figure 20:
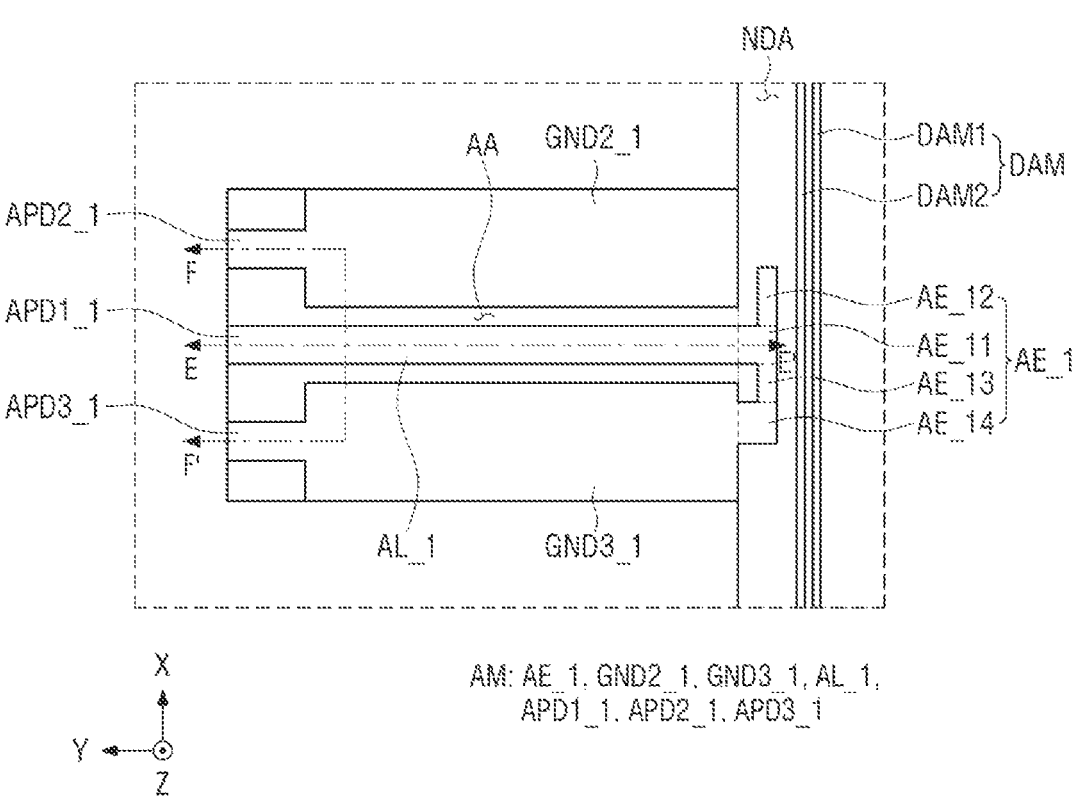
FIG. 20 is a plan view illustrating an example of the antenna area shown in FIG. 1.
Figure 21:
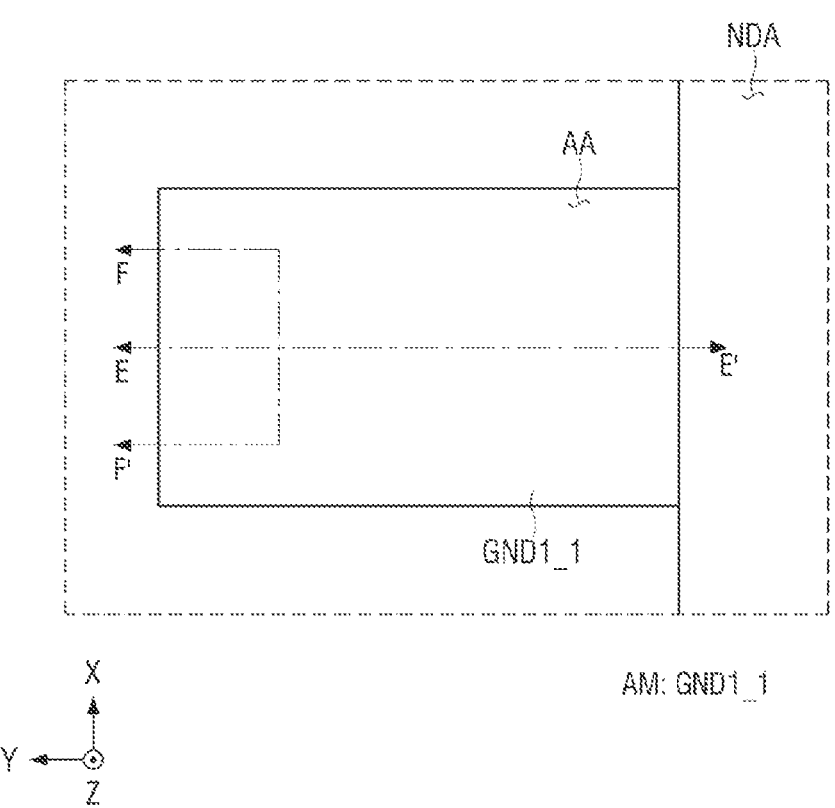
FIG. 21 is a bottom view illustrating an example of the antenna area shown in FIG. 1.

FIG. 20 is a plan view illustrating an example of the antenna area shown in FIG. 1. FIG. 21 is a bottom view illustrating an example of the antenna area shown in FIG. 1.

Referring to FIGS. 20 and 21, the antenna module AM_1 according to one or more embodiments may include an antenna electrode AE_1, a feed line AL_1, a first electrode GND1_1, a second electrode GND2_1, a third electrode GND3_1, a first antenna pad APD1_1, a second antenna pad APD2_1, and a third antenna pad APD3_1.

The antenna electrode AE_1 may be disposed on the upper surface of the substrate SUB. The antenna electrode AE_1 may be disposed in the non-display area NDA of the main area MA. The antenna electrode AE may be disposed outside the dam DAM in the non-display area NDA.

The antenna electrode AE_1 may be a planar inverted f antenna (PIFA). For example, the antenna electrode AE_1 may include a first electrode portion AE_11, a second electrode portion AE_12, a third electrode portion AE_13, and a fourth electrode portion AE_14.

The first electrode portion AE_11 may protrude toward the feed line AL_1 in the same direction as the extension direction of the feed line AL_1. That is, the first electrode portion AE_11 may protrude from the feed line AL_1 in the second direction (Y-axis direction).

The second electrode portion AE_12 may protrude from one side of the first electrode portion AE_11 in the first direction (X-axis direction). The second electrode portion AE_11 may overlap the second electrode GND2 in the second direction (Y-axis direction).

The third electrode portion AE_13 may protrude in the first direction (X-axis direction) from the other side of the first electrode portion AE_11.

The fourth electrode portion AE_14 may protrude from the third electrode GND3 in the second direction (Y-axis direction). The fourth electrode portion AE14 serves to connect the third electrode portion AE_13 and the third electrode GND3.

Since the second electrode portion AE_12 of the antenna electrode AE overlaps the second electrode GND2 in the second direction (the Y-axis direction), the capacitance between the second electrode portion AE_12 and the second electrode GND2 capacitance increases. Accordingly, the overall length of the antenna electrode AE may be reduced through impedance matching, by adding an L-shaped structure formed by the third electrode portion AE_13 and the fourth electrode portion AE_14 to a parallel-L structure formed by the first electrode portion AE_11 and the second electrode portion AE_12.

The lengths of the first electrode portion AE_11, the second electrode portion AE_12, the third electrode portion AE_13, and the fourth electrode portion AE_14 may depend on the frequency of electromagnetic waves to be transmitted and received using the antenna electrode AE. For example, when the frequency of the electromagnetic wave to be transmitted and received using the antenna electrode AE is about 60 GHz, the length of the antenna electrode AE in the first direction (X-axis direction) may be about 0.95 mm.

The length in the second direction (Y-axis direction) of the first electrode portion AE_11 and the length in the second direction (Y-axis direction) of the fourth electrode portion AE_14 may be smaller than the distance between the dam DAM from the boundary between the non-display area NDA and the antenna area AA. Referring to an example, the distance between the dam DAM from the boundary between the non-display area NDA and the antenna area AA may be about 300 μm. As a result, the size of the bezel may be reduced. In this case, the length of the first electrode portion AE_11 in the second direction (Y-axis direction) and the length of the fourth electrode portion AE_14 in the second direction (Y-axis direction) may be about 300 μm or less.

The feed line AL_1 may be disposed on the upper surface of the substrate SUB. The feed line AL_1 may be disposed in the antenna area AA. The extension direction of the feed line AL_1 may be the same as the extension direction of the antenna area AA. For example, when the antenna area AA protrudes from the upper side of the main area MA as shown in FIGS. 1 and 2, the feed line AL_1 may extend in the second direction (Y-axis direction). Alternatively, when the antenna area AA protrudes from the left side of the main area MA as shown in FIGS. 5 and 6 or from the right side of the main area MA as shown in FIGS. 7 and 8, the feed line AL_1 may extend in the first direction (X-axis direction).

The second electrode GND2_1 and the third electrode GND3_1 may be disposed on the upper surface of the substrate SUB. The second electrode GND2_1 and the third electrode GND3_1 may be disposed in the antenna area AA.

The second electrode GND2_1 may be disposed on one side of the feed line AL_1, and the third electrode GND3_1 may be disposed on the other side of the feed line AL_1. The second electrode GND2_1 and the third electrode GND3_1 may be disposed apart from the feed line AL_1. A ground voltage may be applied to the second electrode GND2_1 and the third electrode GND3_1.

The area of the second electrode GND2_1 and the area of the third electrode GND3_1 may be substantially the same. The area of the second electrode GND2_1 and the area of the third electrode GND3_1 may be larger than the area of the feed line AL_1.

The length in the second direction (Y-axis direction) of the feed line AL_ may be longer than the maximum length in the second direction (Y-axis direction) of the second electrode GND2_1 and the maximum length in the second direction (Y-axis direction) of the third electrode GND3_1. The maximum length in the first direction (X-axis direction) of the feed line AL_1 may be longer than the maximum length in the first direction (X-axis direction) of the second electrode GND2_1 and the maximum length in the first direction (X-axis direction) of the third electrode GND3_1.

Since the feed line AL_1, the second electrode GND2_1, and the third electrode GND3_1 are formed by the same process, they may be formed of the same material.

The first electrode GND1_1 may be disposed on the lower surface of the substrate SUB. The first electrode GND1_1 may be disposed in the antenna area AA. The first electrode GND1_1 may be disposed in the entire antenna area AA as shown in FIG. 21. However, embodiments of the present disclosure are not limited thereto. A ground voltage may be applied to the first electrode GND1_1.

The first electrode GND1_1 may overlap the feed line AL_1, the second electrode GND2_1, and the third electrode GND3_1 in the third direction (Z-axis direction). Due to the first electrode GND1_1, the second electrode GND2_1, and the third electrode GND3_1, the feed line AL_1 may have a ground coplanar wave guide (GCPW) structure.

The first antenna pad APD1_1, the second antenna pad APD2_1, and the third antenna pad APD3_1 may be disposed on the upper surface of the substrate SUB. The first antenna pad APD1_1, the second antenna pad APD2_1, and the third antenna pad APD3_1 may be disposed at one edge of the antenna area AA.

The first antenna pad APD1_1 may be connected to one end of the feed line AL_1. The first antenna pad APD1_1 may be integrally formed with the feed line AL_1.

The second antenna pad APD2_1 may be connected to one end of the second electrode GND2_1. The second antenna pad APD2_1 may be integrally formed with the second electrode GND2_1.

The third antenna pad APD3_1 may be connected to one end of the third electrode GND3_1. The third antenna pad APD3_1 may be integrally formed with the second electrode GND3_1.

The first antenna pad APD1_1, the second antenna pad APD2_1, and the third antenna pad APD3_1 may be connected to the antenna circuit board 340 by using a conductive adhesive member (see CAM in FIG. 25) such as the anisotropic conductive film and the conductive adhesive member.

According to one or more embodiments, the first electrode GND1_1 may also be connected to the antenna pad, and in this case, may be connected to the antenna circuit board 340 using the conductive adhesive member such as the anisotropic conductive film and the anisotropic conductive adhesive.

Figure 22:
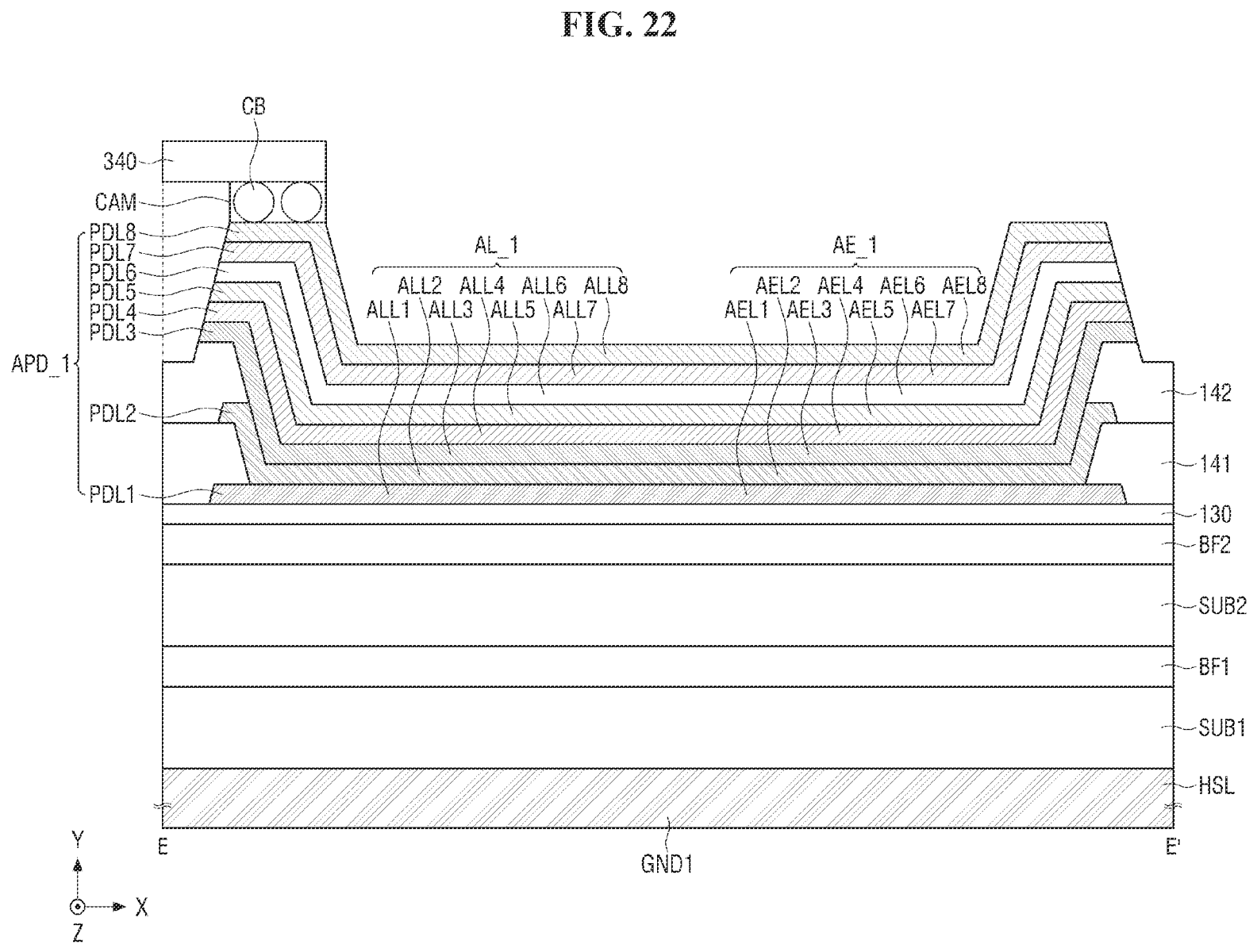
Figure 23:
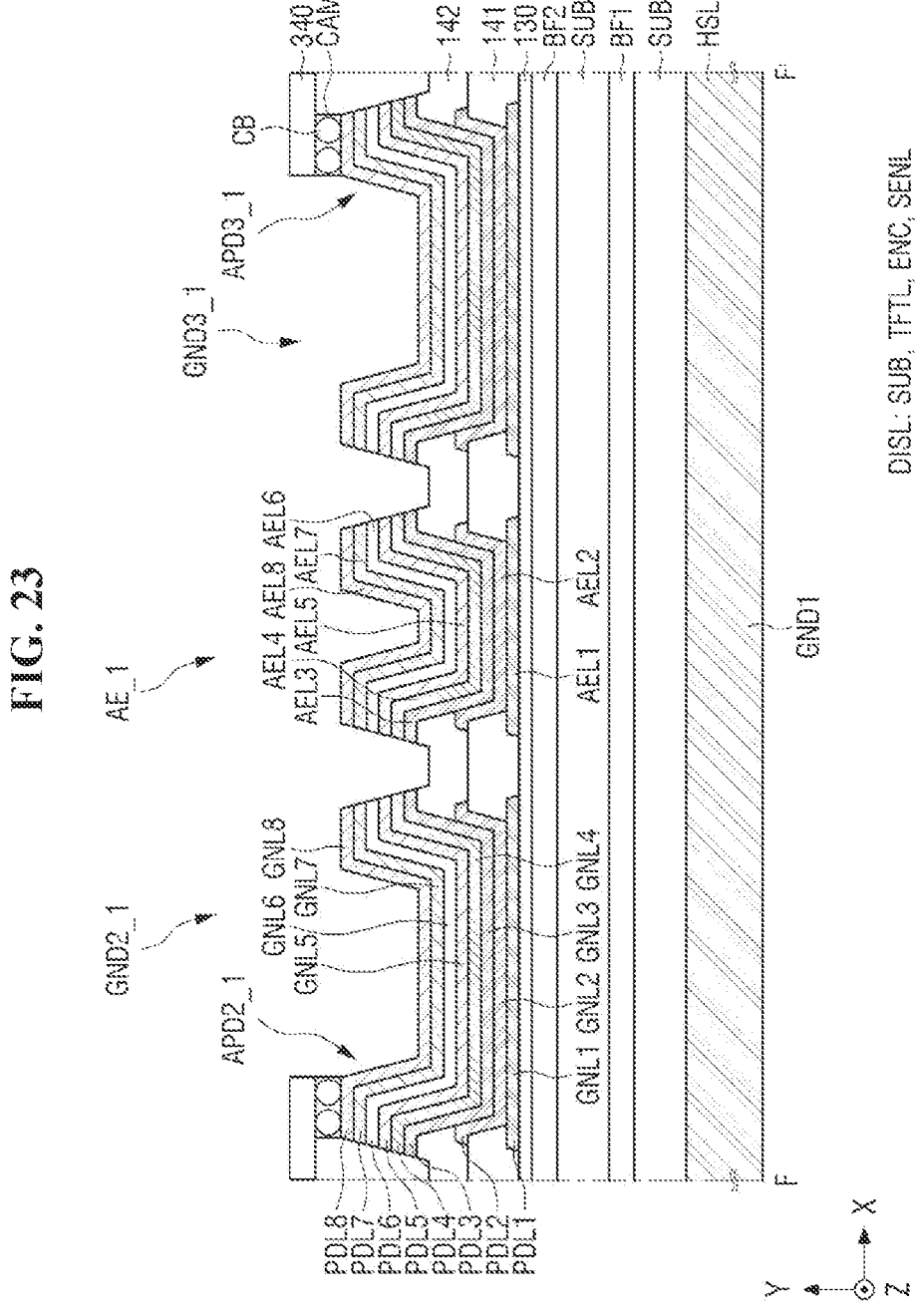
FIG. 23 is a cross-sectional view illustrating an example of the display device taken along line F-F of FIGS. 20 and 21.

FIG. 22 is a cross-sectional view illustrating an example of the display device taken along line E-E' of FIGS. 20 and 21. FIG. 23 is a cross-sectional view illustrating an example of the display device taken along line F-F' of FIGS. 20 and 21.

Embodiments according to FIGS. 22 and 23 are different from embodiments according to FIGS. 14 and 15 in that the first electrode GND1_1 is disposed on the lower surface of the first substrate SUB1 of the substrate SUB, and the feed line AL_1, the second electrode GND2_1, the third electrode GND3_1, the first antenna pad APD1, the second antenna pad APD2, and the third antenna pad APD3 are disposed on the upper surface of the substrate SUB. In describing FIGS. 22 and 23, for convenience of explanation, differences relative to FIGS. 14 and 15 will be mainly described.

Referring to FIGS. 22 and 23, the feed line AL_1 may include the first to eighth feed line layers. However, embodiments of the present disclosure are not limited thereto. For example, according to one or more embodiments, the feed line AL_1 may include only some of the first to eighth feed line layers.

The first to eighth feed line layers may be integrally formed with the first to eighth antenna electrode layers AEL1 to AEL8. That is, the first to eighth feed line layers are substantially the same as the first to eighth antenna electrode layers AEL1 to AEL8 described with reference to FIGS. 14 and 15. Therefore, a further description of the first to eighth feed line layers will be omitted.

Each of the second electrode GND2_1 and the third electrode GND3_1 may include the first to eighth electrode layers GNL1 to GNL8. However, embodiments of the present disclosure are not limited thereto. For example, according to one or more embodiments, each of the second electrode GND2_1 and the third electrode GND3_1 may include only some electrode layers among the first to eighth electrode layers GNL1 to GNL8.

The first to eighth electrode layers GNL1 to GNL8 of each of the second electrode GND2_1 and the third electrode GND3_1 are substantially the same as described with reference to FIGS. 14 and 15. Therefore, for convenience of explanation, a further description of the first to eighth electrode layers GNL1 to GNL8 of the second electrode GND2_1 and the third electrode GND3_1 will be omitted.

Each of the first antenna pad APD1_1, the second antenna pad APD2_1, and the third antenna pad APD3_1 may include the first to eighth pad electrode layers PDL1 to PDL8. However, embodiments of the present disclosure are not limited thereto. For example, according to embodiments, each of the first antenna pad APD1_1, the second antenna pad APD2_1, and the third antenna pad APD3_1 may include only some electrode layers among the first to eighth pad electrode layers PDL1 to PDL8.

The first to eighth pad electrode layers PDL1 to PDL8 of each of the first antenna pad APD1_1, the second antenna pad APD2_1, and the third antenna pad APD3_1 are substantially the same as the first to eighth pad electrode layers PDL1 to PDL8 of each of the display pads DPD described with reference to FIG. 16. Therefore, for convenience of explanation, a further description of the first to eighth pad electrode layers PDL1 to PDL8 of each of the first antenna pad APD1_1, the second antenna pad APD2_1, and the third antenna pad APD3_1 will be omitted.

The first electrode GND1_1 may be disposed on the lower surface of the first substrate SUB1 of the substrate SUB. The first electrode GND1_1 may be formed of the same material as the heat dissipation layer HSL of the panel bottom cover PB. The thickness of the first electrode GND1_1 may be greater than the thickness of the antenna electrode AE_1, the thickness of the feed line AL_1, the thickness of the second electrode GND2_1, the thickness of the third electrode GND3_1, the thickness of the first antenna pad APD1_1, the thickness of the second antenna pad APD2_1, and the third antenna pad APD3_1. Therefore, the thickness of the first electrode GND1_1 may be greater than the sum of the thicknesses of the first to eighth antenna electrode layers AEL1 to AEL8 of the antenna electrode AE_1. Also, the thickness of the first electrode GND1_1 may be greater than the sum of thicknesses of the first to eighth feed line layers of the feed line AL_1. Also, the thickness of the first electrode GND1_1 may be greater than the sum of the thicknesses of the first to eighth electrode layers GNL to GNL8 of the second electrode GND2_1 and the third electrode GND3_1. In addition, the thickness of the first electrode GND1_1 may be greater than the sum of the thicknesses the first to eighth pad electrode layers PDL1 to PDL8 of each of the first antenna pad APD1_1, the second antenna pad APD2_1, and the third antenna pad APD3_1.

Further, the thickness of the antenna electrode AE_1, the thickness of the feed line AL_1, the thickness of the second electrode GND2_1, the thickness of the third electrode GND3_1, the thickness of the first antenna pad APD1_1, the thickness of the second antenna pad APD2_1, and the thickness of the third antenna pad APD3_1 may be the same.

According to one or more embodiments, there is no need to add a separate process to form the antenna electrode AE_1, the second electrode GND2_1, the third electrode GND3_1, the first antenna pad APD1_1, the second antenna pad APD2_1, and the third antenna pad APD3_1 by forming the first to eighth antenna electrode layers AEL1 to AEL8 of the antenna electrode AE_1, the first to eighth feed line layers of the feed line AL_1, the second electrode GND2_1, the first to eighth electrode layers GNL1 to GNL8 of each of the second electrode GND2_1 and the third electrode GND3_1, the first to eighth pad electrode layers PDL1 to PDL8 of each of the first antenna pad APD1_1, the second antenna pad APD2_1, and the third antenna pad APD3_1, respectively, with the same material in the same process as the electrodes of the thin film transistor layer TFTL, the light emitting device layer EML, and the sensor electrode layer SENL.

Also, according to one or more embodiments, there is no need to add a separate process to form the first electrode GND1_1 by forming the first electrode GND1_1 of the same material as the heat dissipation layer HSL of the panel bottom cover PB.

Figure 24:
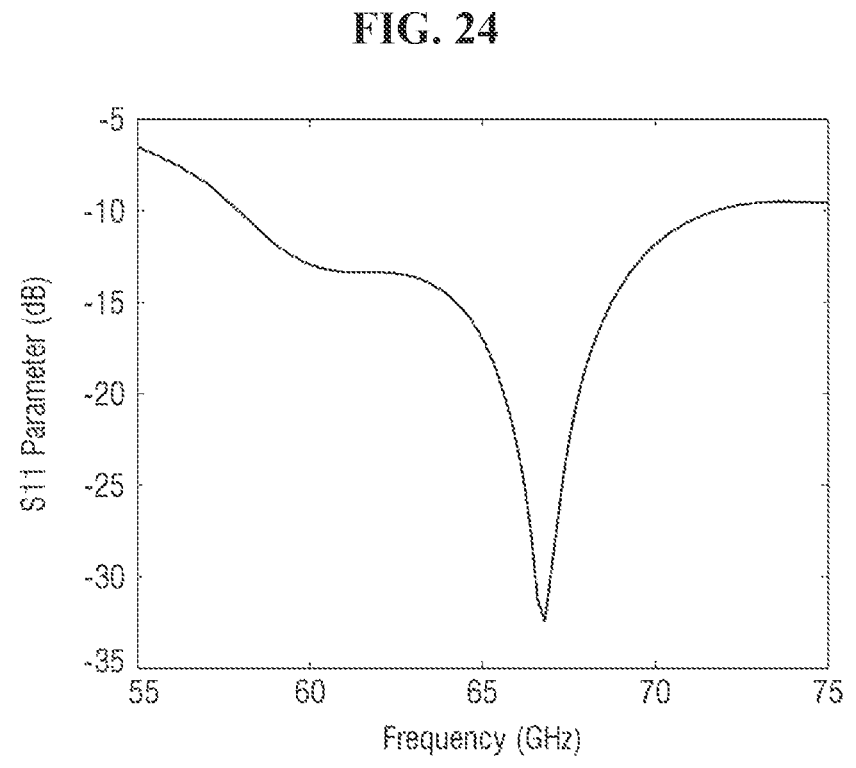

FIG. 24 is a graph illustrating a reflection coefficient of an antenna module according to a frequency according to one or more embodiments.

In FIG. 24, the X-axis represents the frequency (GHz), and the Y-axis represents S11, which is a value representing the ratio of the magnitude of the input signal to the magnitude of the signal that is reflected back of the input signal. S11 is a reflection coefficient of the antenna module AM, and the unit may be dB.

Referring to FIG. 24, the antenna module AM according to an embodiment has a minimum value of −32 dB at about 66 GHz. Therefore, the antenna module AM according to an embodiment may operate at about 66 GHz.

Since the frequency band in which the S11 value of the antenna module AM according to an embodiment is −10 dB or less is about 57 GHz to about 71 GHz, the −10 dB impedance bandwidth of the antenna module AM according to an embodiment may be about 14 GHz. That is, the antenna module AM embedded in the display panel 300 may have a fairly wide bandwidth according to one or more embodiments. Since the antenna module AM according to an embodiment may transmit and receive electromagnetic waves of a wide band having a reflection coefficient of about 14 GHz and a high frequency band of about 57 GHz or more, the antenna module AM may be utilized as an FMCW radar antenna.

Figure 25:
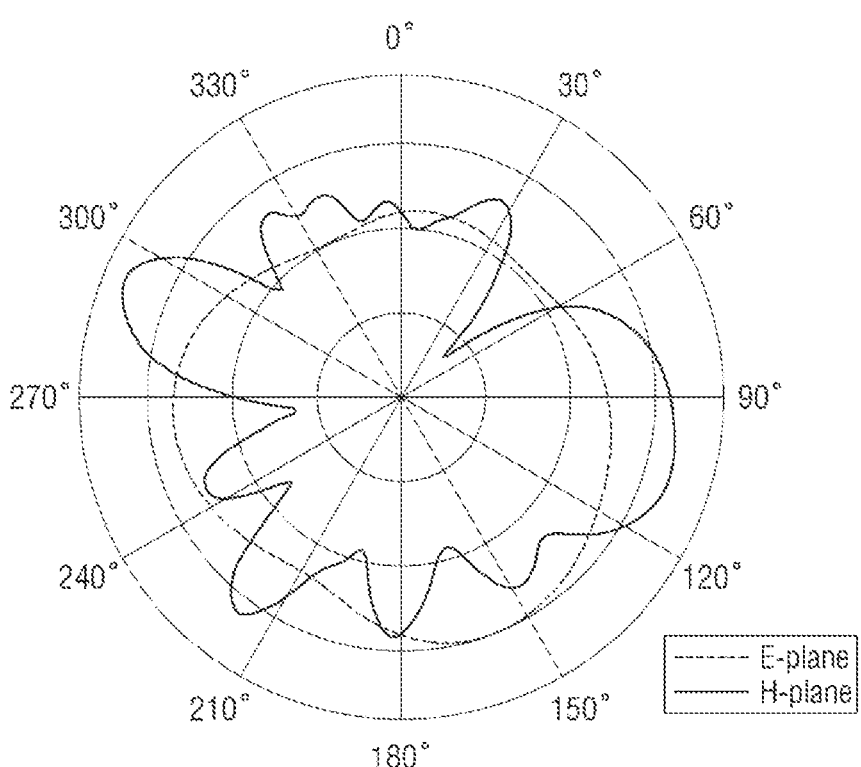
FIG. 25 is a graph illustrating a 3D radiation pattern of an antenna module according to one or more embodiments.
Figure 26:
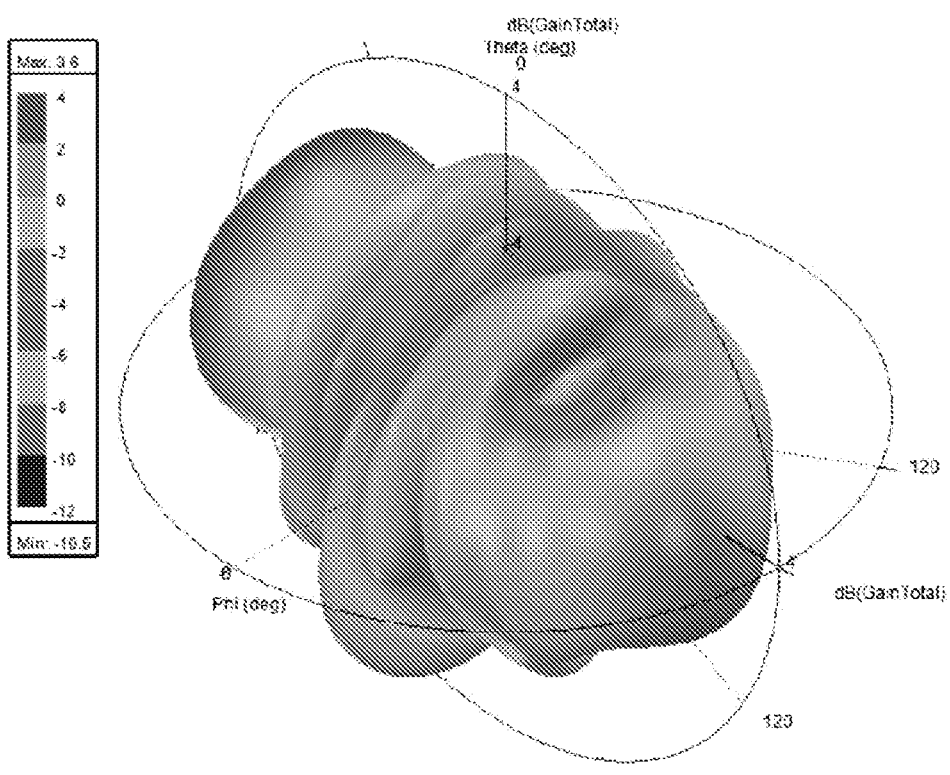
FIG. 26 is a graph illustrating radiation patterns of E-plane and H-plane of an antenna module according to one or more embodiments.

FIG. 25 is a graph illustrating a 3D radiation pattern of an antenna module according to one or more embodiments. FIG. 26 is a graph illustrating radiation patterns of E-plane and H-plane of an antenna module according to one or more embodiments. FIG. 25 shows a 3D radiation pattern of the antenna module AM according to a frequency signal of about 66 GHz. The radiation patterns of the E-plane and H-plane of the antenna module AM according to the frequency signal of about 66 GHz are shown.

Referring to FIGS. 25 and 26, the antenna module AM according to an embodiment has an omni-directional radiation pattern similar to a monopole antenna on a plane formed by an x-axis and a z-axis. Also, the maximum gain of the antenna module AM according to an embodiment is about 3.56 dB at 0=90°.

Figure 28:
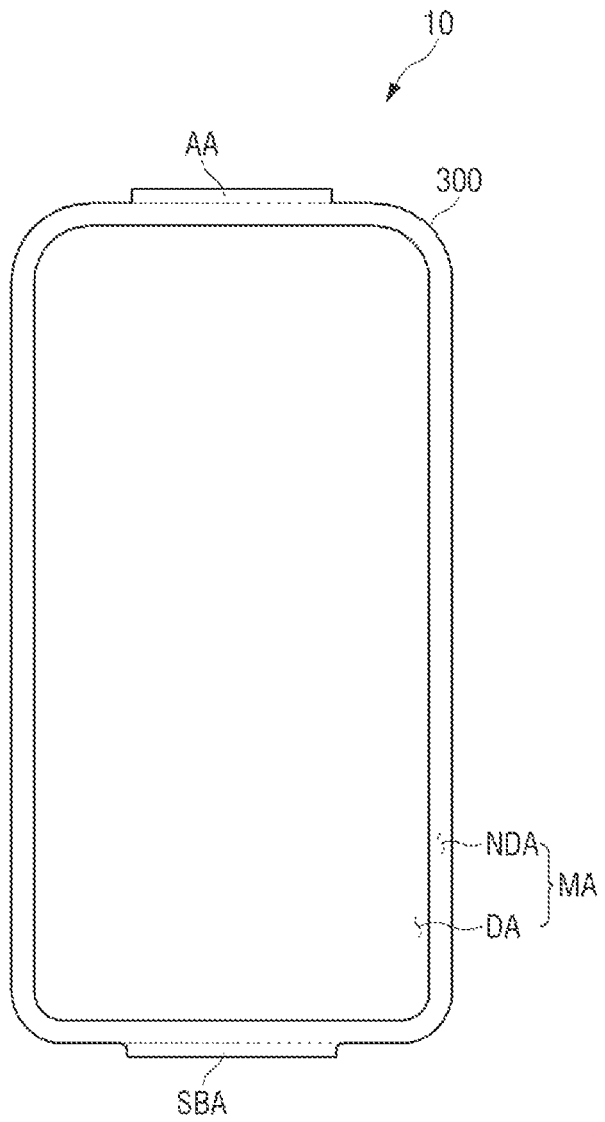

FIGS. 27 and 28 are plan views illustrating a display device according to one or more embodiments.

Embodiments according to FIGS. 27 and 28 are different from embodiments according to FIGS. 1 and 2 in that the length of the antenna area AA in the first direction (X-axis direction) is extended. Referring to FIGS. 27 and 28, for convenience of explanation, a further description of components and technical aspects previously described with reference to FIGS. 1 and 2 will be omitted.

As shown in FIGS. 27 and 28, when the antenna area AA protrudes from the upper side of the main area MA in the second direction (Y-axis direction), the length in the first direction (X-axis direction) of the antenna area AA may be extended. Alternatively, when the antenna area AA protrudes in the first direction (X-axis direction) from the left or right side of the main area MA, the length in the second direction (Y-axis direction) of the antenna area AA may be extended. When the antenna area AA is extended, the transmission and reception sensitivity of electromagnetic waves may be increased since a plurality of antenna electrodes (AE_2 in FIG. 29) may be formed in the antenna area AA.

FIG. 29 is a plan view illustrating an example of the antenna area of FIG. 27. FIG. 30 is a bottom view illustrating an example of the antenna area of FIG. 27.

Referring to FIGS. 29 and 30, a plurality of antenna modules may be disposed in the antenna area AA. FIGS. 29 and 30 illustrate that four antenna modules AM are disposed in the antenna area AA. However, embodiments are not limited thereto. For example, according to one or more embodiments, the number of antenna modules disposed in the antenna area AA may be determined according to the desired antenna performance.

When the antenna area AA protrudes from the upper side of the main area MA in the second direction (Y-axis direction), the plurality of antenna modules AM may be disposed in the first direction (X-axis direction).

A distance between the centers of the antenna electrodes AE of the antenna modules adjacent to each other in the first direction (X-axis direction) among the plurality of antenna modules AM may vary according to the frequency of the electromagnetic wave to be transmitted and received using the plurality of antenna modules AM. For example, when the frequency of the electromagnetic wave to be transmitted and received using the plurality of antenna modules AM is about 60 GHz, the distance between the centers of the antenna electrodes AE of the antenna modules adjacent to each other in the first direction (X-axis direction) may be about 2.5 mm. However, embodiments of the present disclosure are not limited thereto.

Each of the plurality of antenna modules AM may be connected to the antenna driving circuit 350 through the antenna circuit board 340. Each of the plurality of antenna modules AM may serve as an independent antenna by the antenna driving circuit 350. In this case, each of the plurality of antenna modules AM may be time-division driven to serve as an antenna capable of both transmission and reception. Alternatively, some of the plurality of antenna modules AM may serve as transmit antennas for transmitting electromagnetic waves, and others may serve as receive antennas for receiving electromagnetic waves. Alternatively, each of the plurality of antenna modules AM may serve as one array antenna by the antenna driving circuit 350 in the antenna driving circuit 350, and in this case, beam steering may be possible.

Since each of the plurality of antenna modules AM is substantially the same as the antenna module AM described with reference to FIGS. 11 and 12, a further description of each of the plurality of antenna modules AM will be omitted.

FIG. 31 is a graph illustrating a reflection coefficient of an antenna module according to one or more embodiments. FIG. 31 shows the 3D radiation pattern of the antenna module AM according to a frequency signal of about 60 GHz.

Referring to FIG. 31, when the transmission signal having the same phase is applied to each of the plurality of antenna modules AM, highly directional radiation is possible in the third direction (Z-axis direction). When the antenna area AA includes the plurality of antenna modules AM, a gain (about 7 dB) may be relatively higher than that when including one antenna module AM.

FIG. 32 is a plan view illustrating an example of the antenna area of FIG. 27. FIG. 33 is a bottom view illustrating an example of the antenna area of FIG. 27.

Embodiments according to FIGS. 32 and 33 are different from embodiments according to FIGS. 29 and 30 in that each of the plurality of antenna modules AM includes the antenna module AM described with reference to FIGS. 20 and 21. Therefore, for convenience of explanation, a further detailed description of FIGS. 32 and 33 will be omitted.

While the present disclosure has been particularly shown and described with reference to embodiments thereof, it will be understood by those of ordinary skill in the art that various changes in form and detail may be made therein without departing from the spirit and scope of the present disclosure as defined by the following claims. The embodiments of the present disclosure described herein should be considered in a descriptive sense only and not for purposes of limitation.

What is claimed is:

1. A display device, comprising:
   a substrate including a display area in which an image is displayed, a non-display area disposed around the display area, and an antenna area protruding from the non-display area;
   an antenna electrode disposed on one surface of the substrate in the non-display area;
   a first electrode disposed on the one surface of the substrate in the antenna area and spaced apart from the antenna electrode; and
   a feed line disposed on another surface of the substrate, which is opposite to the one surface, in the antenna area,
   wherein the antenna electrode is connected to the feed line through a hole that penetrates the substrate, and
   wherein the first electrode overlaps the feed line in a thickness direction of the substrate.

2. The display device of claim 1, wherein the antenna electrode is a patch antenna electrode having a rectangular planar shape.

3. The display device of claim 1, wherein the antenna electrode is extended in one direction, and the feed line is extended in another direction crossing the one direction.

4. The display device of claim 1, wherein a thickness of the antenna electrode is about equal to a thickness of the first electrode.

5. The display device of claim 1, wherein a thickness of the antenna electrode is smaller than a thickness of the feed line.

6. The display device of claim 1, further comprising:
   a second electrode disposed on the another surface of the substrate in the antenna area and disposed on one side of the feed line; and
   a third electrode disposed on the another surface of the substrate in the antenna area and disposed on another side of the feed line which opposes the one side of the feed line.

7. The display device of claim 6, wherein the second electrode and the third electrode overlap the first electrode in a thickness direction of the substrate.

8. The display device of claim 6, wherein a thickness of the antenna electrode is about equal to a thickness of the second electrode and a thickness of the third electrode.

9. The display device of claim 6, wherein a thickness of the second electrode and a thickness of the third electrode are smaller than a thickness of the first electrode.

10. The display device of claim 6, further comprising:
    an antenna circuit board disposed on a first antenna pad disposed at one end of the feed line, a second antenna pad disposed at one end of the second electrode, and a third antenna pad disposed on one end of the third electrode;
    a conductive adhesive member disposed between each of the first antenna pad, the second antenna pad, and the third antenna pad and the antenna circuit board;
    a main circuit board including a second connector connected to a first connector disposed at one end of the antenna circuit board; and
    an antenna driving circuit disposed on the main circuit board and configured to transmit and receive electromagnetic waves of the antenna electrode.

11. The display device of claim 10, wherein the hole is disposed at another end of the feed line that opposes the one end of the feed line.

12. The display device of claim 1, further comprising:

a dam that surrounds the display area in the non-display area, wherein the antenna electrode is disposed between the dam and an edge of the substrate.

13. An electronic device including a display device, comprising:

a substrate including a display area in which an image is displayed, a non-display area disposed around the display area, and an antenna area protruding from the non-display area;

an antenna electrode disposed on one surface of the substrate in the non-display area;

a first electrode disposed on the one surface of the substrate in the antenna area and spaced apart from the antenna electrode; and a feed line disposed on another surface of the substrate, which is opposite to the one surface, in the antenna area, wherein the antenna electrode is connected to the feed line through a hole that penetrates the substrate, and wherein the first electrode overlaps the feed line in a thickness direction of the substrate.

14. The electronic device of claim 13, wherein the antenna electrode is a patch antenna electrode having a rectangular planar shape.

15. The electronic device of claim 13, wherein the antenna electrode is extended in one direction, and the feed line is extended in another direction crossing the one direction.

16. The electronic device of claim 13, wherein a thickness of the antenna electrode is about equal to a thickness of the first electrode.

17. The electronic device of claim 13, wherein a thickness of the antenna electrode is smaller than a thickness of the feed line.

18. The electronic device of claim 13, further comprising:

a second electrode disposed on the another surface of the substrate in the antenna area and disposed on one side of the feed line; and a third electrode disposed on the another surface of the substrate in the antenna area and disposed on another side of the feed line which opposes the one side of the feed line.

19. The electronic device of claim 13, further comprising:

a dam that surrounds the display area in the non-display area, wherein the antenna electrode is disposed between the dam and an edge of the substrate.

* * * * *